United States Patent
Chao et al.

(10) Patent No.: US 12,490,500 B2
(45) Date of Patent: Dec. 2, 2025

(54) SEMICONDUCTOR DEVICE AND PROCESSES FOR MAKING SAME

(71) Applicant: Diodes Incorporated, Plano, TX (US)

(72) Inventors: Kuo-Liang Chao, Chubei (TW); Pin-Hao Huang, New Taipei (TW)

(73) Assignee: Diodes Incorporated, Plano, TX (US)

(*) Notice: Subject to any disclaimer, the term of this patent is extended or adjusted under 35 U.S.C. 154(b) by 788 days.

(21) Appl. No.: 17/518,657

(22) Filed: Nov. 4, 2021

(65) Prior Publication Data

US 2024/0290783 A1    Aug. 29, 2024

(51) Int. Cl.
  *H10D 84/00* (2025.01)
  *H10D 8/01* (2025.01)
  *H10D 8/60* (2025.01)
  *H10D 84/03* (2025.01)

(52) U.S. Cl.
  CPC ........... *H10D 84/221* (2025.01); *H10D 8/051* (2025.01); *H10D 8/605* (2025.01); *H10D 84/038* (2025.01)

(58) Field of Classification Search
  CPC .............. H01L 27/0814; H01L 21/822; H01L 29/66143; H01L 29/8725; H01L 21/762; H01L 21/76224; H01L 23/3157; H10D 84/221; H10D 8/051; H10D 8/605; H10D 84/038; H10D 64/23; H10D 8/60
  See application file for complete search history.

(56) References Cited

U.S. PATENT DOCUMENTS

| | | | |
|---|---|---|---|
| 5,468,676 A | | 11/1995 | Madan |
| 5,767,578 A | * | 6/1998 | Chang ................. H01L 23/3732 |
| | | | 257/713 |
| 8,928,112 B2 | | 1/2015 | Liou et al. |
| 9,356,045 B2 | | 5/2016 | Comeau et al. |
| 9,972,679 B2 | | 5/2018 | Kataoka et al. |
| 10,347,599 B2 | | 7/2019 | Hekmatshoartabari et al. |
| 10,629,540 B2 | * | 4/2020 | Yu ....................... H01L 23/5383 |
| 2005/0159007 A1 | | 7/2005 | Chen et al. |
| 2008/0017895 A1 | * | 1/2008 | Fallica .................. H10D 10/40 |
| | | | 257/E21.612 |
| 2015/0123240 A1 | | 5/2015 | Crockett |
| 2017/0047373 A1 | | 2/2017 | Peng et al. |

FOREIGN PATENT DOCUMENTS

| | | |
|---|---|---|
| CN | 101632176 A | 1/2010 |
| CN | 1728046 B | 7/2010 |
| CN | 1578078 B | 8/2010 |
| CN | 102445671 A | 5/2012 |
| CN | 102577057 A | 7/2012 |
| CN | 102779778 A | 11/2012 |

(Continued)

OTHER PUBLICATIONS

Baprawski J., et al., "SerDes System CTLE Basics," Mar. 22, 2012, pp. 1-10.

(Continued)

*Primary Examiner* — Steven B Gauthier
*Assistant Examiner* — Khatib A Rahman
(74) *Attorney, Agent, or Firm* — AP3 Law Firm PLLC

(57) ABSTRACT

The disclosure provides a semiconductor package having an isolation structure comprising an isolation trench filled with dielectric material, where the isolation structure traverses the thickness of the isolated semiconductor dies.

20 Claims, 38 Drawing Sheets

(56) References Cited

FOREIGN PATENT DOCUMENTS

| | | | |
|---|---|---|---|
| CN | 102792572 A | 11/2012 |
| CN | 103929162 A | 7/2014 |
| CN | 104022776 A | 9/2014 |
| CN | 104079282 A | 10/2014 |
| CN | 204144257 U | 2/2015 |
| CN | 204145828 U | 2/2015 |
| CN | 105680694 A | 6/2016 |
| CN | 105762200 A | 7/2016 |
| CN | 105932657 A | 9/2016 |
| CN | 106206459 A | 12/2016 |
| CN | 106879125 A | 6/2017 |
| CN | 107076806 A | 8/2017 |
| CN | 107294369 A | 10/2017 |
| CN | 207410218 U | 5/2018 |
| CN | 108233901 A | 6/2018 |
| CN | 108270408 A | 7/2018 |
| CN | 108462388 A | 8/2018 |
| CN | 109727940 A | 5/2019 |
| CN | 208849736 U | 5/2019 |
| CN | 209029364 U | 6/2019 |
| CN | 209344068 U | 9/2019 |
| CN | 111564439 A | 8/2020 |
| CN | 111799992 A | 10/2020 |
| CN | 112054774 A | 12/2020 |
| CN | 112289867 A | 1/2021 |
| CN | 112313881 A | 2/2021 |
| CN | 112996189 A | 6/2021 |
| CN | 113141109 A | 7/2021 |
| CN | 213988878 U | 8/2021 |
| CN | 113659014 A | 11/2021 |
| CN | 114242682 A | 3/2022 |
| CN | 216413076 U | 4/2022 |
| CN | 115000023 A | 9/2022 |
| EP | 1875452 A2 | 1/2008 |
| EP | 2137571 B1 | 11/2012 |
| EP | 3768371 A1 | 1/2021 |
| JP | 2000115889 A | 4/2000 |
| JP | 2018157023 A | 10/2018 |
| KR | 101539438 B1 | 8/2015 |
| KR | 20160082689 A | 7/2016 |
| KR | 20180028990 A | 3/2018 |
| KR | 20200000322 A | 1/2020 |
| KR | 20210091659 A | 7/2021 |
| RO | 127778 A2 | 8/2012 |
| TW | 396505 B | 7/2000 |
| TW | I271685 B | 1/2007 |
| TW | 200708026 A | 2/2007 |
| TW | 200812243 A | 3/2008 |
| TW | 201121238 A | 6/2011 |
| TW | 201121239 A | 6/2011 |
| TW | 201125271 A | 7/2011 |
| TW | 201140787 A | 11/2011 |
| TW | 201338184 A | 9/2013 |
| TW | 201611492 A | 3/2016 |
| TW | I530078 B | 4/2016 |
| TW | I557857 B | 11/2016 |
| TW | 201813107 A | 4/2018 |
| TW | 201903620 A | 1/2019 |
| TW | 201919175 A | 5/2019 |
| TW | 201923606 A | 6/2019 |
| TW | 202002188 A | 1/2020 |
| TW | 202123403 A | 6/2021 |
| TW | 202129981 A | 8/2021 |
| TW | I736393 B | 8/2021 |
| TW | 202226509 A | 7/2022 |
| TW | 202230682 A | 8/2022 |
| WO | 2015018149 A1 | 2/2015 |
| WO | 2015131172 A1 | 9/2015 |
| WO | 2019015483 A1 | 1/2019 |
| WO | WO2020220665 A1 | 5/2020 |

OTHER PUBLICATIONS

Dai et al., "Trench Schottky Diode Structure and its Preparation Method," Machine Translation of CN105762200A, Jul. 13, 2016, pp. 1-4.
Extended European Search Report for European Application No. 22200978.9, mailed Mar. 15, 2023, 9 pages.
First Office action and Search Report for Chinese Application No. 202110006732.1, mailed on May 11, 2023, 6 pages.
International Search Report and Written Opinion for Application No. PCT/CN2022/102749, mailed on Sep. 6, 2022, 13 pages.
Non-Final Office Action for U.S. Appl. No. 17/066,088, mailed Aug. 9, 2021, 11 Pages.
Notice of Allowance for U.S. Appl. No. 17/066,088, mailed Nov. 12, 2021, 08 Pages.
Notice of Allowance for U.S. Appl. No. 16/667,585, mailed Jun. 18, 2020, 11 Pages.
Office action and Search Report for Taiwan Patent Application No. 110141399, mailed on Mar. 17, 2023, 11 pages.
Office Action and Search Report for Taiwan Patent Application No. 111100919, mailed Apr. 23, 2024, 13 Pages.
Office action and Search Report for Taiwan Patent Application No. 111138688, mailed Jun. 28, 2023, 6 pages.
Office Action and Search Report for Taiwan Patent Application No. 110115845, mailed Jul. 20, 2023, 5 pages.
Office Action and Search Report from Taiwan Patent Application No. 110101379, dated Mar. 30, 2023, 6 Pages.
Office Action and Search Report from Taiwan Patent Application No. 111142891, dated Jul. 10, 2023, 5 pages.
Office Action and Search Report from Taiwan Patent Application No. 112105262, dated Jun. 27, 2023, 7 pages.
Office Action for Korean Patent Application No. 10-2019-0130691, mailed Jun. 1, 2023, 7 pages.
Office Action for Korean Patent Application No. 10-2022-0074272, mailed Mar. 20, 2024, 5 pages.
Office Action for Taiwan Application No. 111100919, mailed Jan. 13, 2023, 4 Pages.
Office Action for Taiwan Application No. 111115745, mailed Mar. 8, 2023, 7 Pages.
Office Action for Taiwan Application No. 111120163, mailed Jan. 10, 2023, 11 Pages.
Office Action for Taiwan Application No. 11121197780, issued on Dec. 2, 2011, 8 Pages.
Witte J.F., et al., "A Current-Feedback Instrumentation Amplifier With 5 μV Offset for Bidirectional High-Side Current-Sensing," IEEE Journal of Solid-state Circuits, Dec. 2008, vol. 43, No. 12, pp. 2769-2775.

* cited by examiner

SEMICONDUCTOR DEVICE AND PROCESSES FOR MAKING SAME

BACKGROUND

Field of the Disclosure

The disclosure relates to an isolation structure where multiple semiconductor dies are integrated within a semiconductor package. In another aspect, the disclosure relates to a semiconductor package.

Description of Related Art

Semiconductor dies are usually packaged before placed on printed circuit board (PCB). One common package form uses leadframe where the die is wirebonded to the leadframe fingers. Another package form avoids wirebonding by placing metal bump electrodes on the chip surface and directly attach electrodes to the PCB. Both package forms involve pick-and-place processes and requires lengthy wirings in the package or on the PCB for interconnection.

Attempts have been made to integrate individual dies that need to be electrically isolated from the adjacent dies in the wafer. One approach is to introduce a properly biased p-n junction structure by implantation and diffusion of associated type of dopants between the adjacent dies, so as to block the current flow between the adjacent semiconductor dies near the surface. However, significant amount of surface area could be wasted for the formation of the p-n junction structure. To be specific, a depth of x μm p-n junction requires at least 2× μm width of surface area to count for lateral diffusion. Furthermore, the formation of the p-n junction structure involves time consuming diffusion process.

Another approach is to employ semiconductor on insulator (SOI) technique plus trench isolation between adjacent dies so each die is surrounded by oxide at the bottom as well as on the four sides. The oxide formed at the bottom side of the die is buried in the semiconductor substrate which involves complicated manufacturing process. Given this, the existing techniques are not cost effective in most applications.

SUMMARY OF THE DISCLOSURE

The disclosure provides a semiconductor device having an isolation structure comprising an isolation trench filled with a dielectric material, where the isolation structure traverses the thickness of the isolated semiconductor dies.

In one aspect of the disclosure, the terminal nodes are disposed on the same side of the semiconductor dies, where the current flow within each isolated semiconductor dies is mainly parallel to the die surface.

In one aspect of the disclosure, diodes is used as circuit element for illustrative purpose, where the terminal nodes includes a cathode on a cathode region of the semiconductor die and an anode on a cathode region of the semiconductor die.

Other circuit element, including MOSFET, can also be used and benefit from the present invention.

In one aspect of the disclosure, the isolated semiconductor dies are fabricated as a unit, starting with a monolithic die.

In one aspect of the disclosure, the isolated semiconductor dies are internally connected into an integrated circuit and packaged as a module that can be easily placed on PCB in flip chip form.

In an embodiment of the disclosure, the isolation structure is formed by adopting a front-end etching process, in which the isolation trench is filled with a dielectric material, such as silicon oxide or polysilicon with or without thermal oxide.

In another embodiment of the disclosure, the isolation structure is formed by adopting a back-end etching process, in which the isolation trench is filled with another dielectric material, such as epoxy resin.

In still another embodiment of the disclosure, the isolation structure is formed by adopting a front-end etching process in combination with a back-end etching process, in which a first isolation structure and a second isolation structure are formed, respectively.

In still another embodiment of the disclosure, a channel filled with metal is introduced in the cathode region of the substrate, where the channel is formed by excavating from the bottom of the substrate up to the junction between the substrate and the epitaxial layer. Alternatively, the channel may extend up to the height protruded into the epitaxial layer.

In the embodiments of the disclosure, the semiconductor die is built with silicon for demonstration. However, other semiconducting materials, including compound semiconductor, such as GaN or SIC, can be used in the present invention.

The disclosed isolation structure can provide sufficient electrical isolation without occupying large amount of surface area of the die for exchange. In addition, the disclosed isolation structure is manufactured by using typical trench and filling processes and is therefore free from advanced or costly process. In another aspect, the disclosed semiconductor device is manufactured in an integrated manner, where repeated pick-and-place process and lengthy wirings process can be avoided.

In order to make the above-mentioned features and advantages of the disclosure more obvious and understandable, the embodiments are specifically described below in detail in conjunction with the accompanying drawings.

DESCRIPTION OF EMBODIMENTS

The embodiments are described in detail below with reference to the accompanying drawings, but the embodiments are not intended to limit the scope of the disclosure. In addition, the drawings are for illustrative purpose only and are not drawn based on the original dimensions, so the size and proportion may not be consistent with the actual dimensions.

The terms "top", "bottom" and "sides" are used in reference to the attached drawing figures and should not be construed as indication of orientation limitations when describing a physical device.

The term "photolithography" refers to a process used in microfabrication to pattern parts on a thin film or the bulk of a wafer, in which a series of treatments including applying photoresist, light exposure, development and curing are performed in the order.

The term "front-end process" refers to the processing steps of the semiconductor dies that usually starts with the fabrication of the circuit elements embedded in and on the dies and ends with the formation of the passivation layer. The term "front-end etching process" refers to the etching process adopted during the "front-end process" which is usually used in forming patterns on the surface of the dies. Typical "front-end etching process" may include, for example, wet chemical etching.

The term "back-end process" refers to the processing steps of the semiconductor dies that usually starts at the completion of the front-end process and usually contains the steps of back-grinding, die bonding, wire bonding, molding, sawing and testing. The term "back-end etching process" refers to the etching process adopted during the "back-end process" which can be used in forming patterns on the bottom of the dies. Typical "back-end etching process" includes, for example, plasma etching or sawing.

Schottky trenched diodes are employed in the embodiments of the present invention as the circuit element for demonstrative purpose where the semiconductor die includes a heavily doped semiconductor substrate with a mildly doped semiconducting epitaxial layer grown thereon. The substrate typically has an electrical resistance of around 1 to 5 mohm*cm and is deemed electrical conductive. To make the cathode and anode accessible on the top surface of the dies, the cathode is configured to connect directly with the substrate so as to direct the electrons, from the heavily doped semiconductor substrate that mainly come from the anode, to the cathode.

Figure 1:
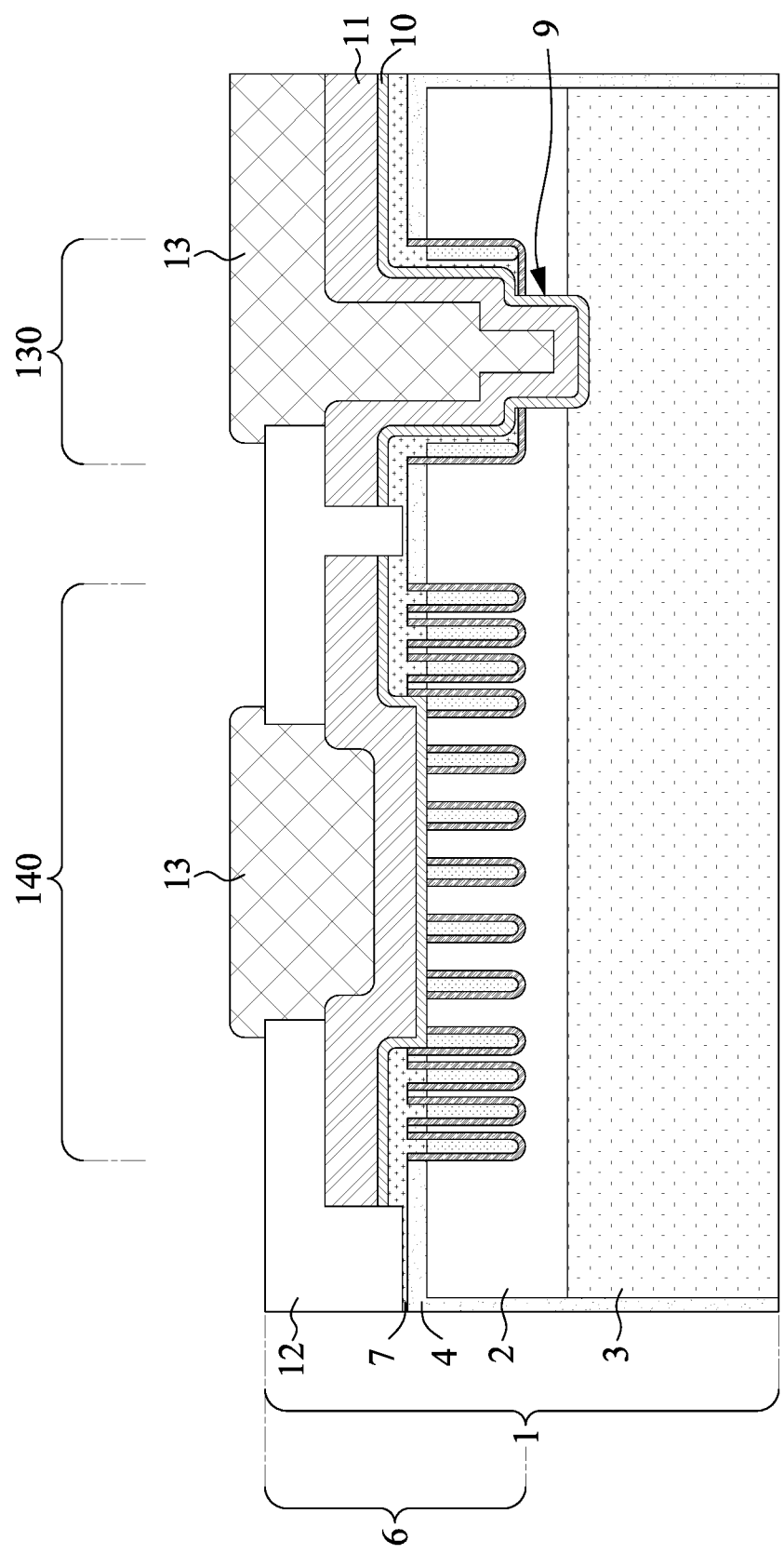
FIG. 1 provides a cross-sectional view of the circuit element exemplified in the embodiments of the present invention.

More specifically, as shown in FIG. 1, for each unit of the diodes, an anode region 140 occupies a portion of the epitaxial layer 2 and a cathode region 130 occupies another portion of the epitaxial layer 2. The anode region 140 contains a plurality of trench filled with polysilicon which is embedded in the epitaxial layer, and a first metal layer 10, e.g., Titanium, is sputtered on the surface of the epitaxial layer 2 for forming schottky junction in the anode region 140. A second metal layer 11, e.g. AlSiCu, is deposited on the first metal layer 10. The cathode region 130 contains a recess 9 excavated from the surface of the epitaxial layer 2 to the surface of the semiconductor substrate 3 and filled with the first metal layer 10 and the second metal layer 11. A passivation layer 12 and a third metal layer 13, e.g., Ni/Au, are applied subsequently on and/or around at least a portion of the second metal layer 11.

Figure 2A:
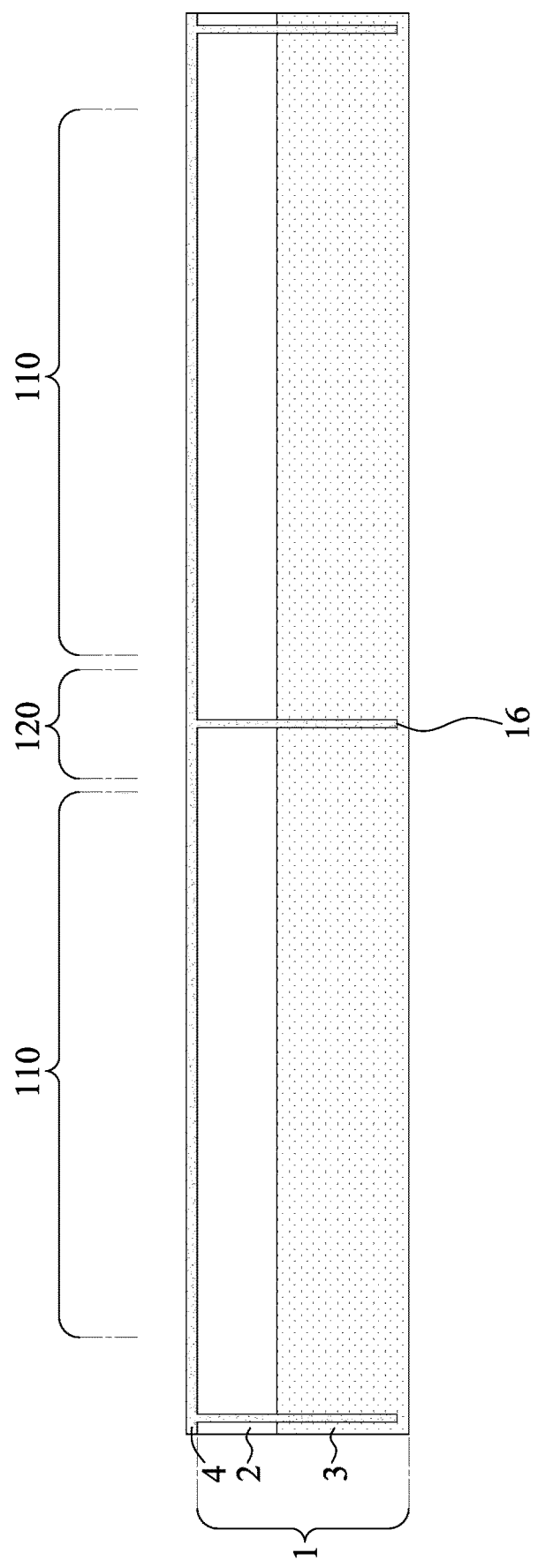
FIG. 2a-2k provides a demonstration of the manufacturing process according to the semiconductor device of the first embodiment.

Referring to the first embodiment as shown in FIG. 2a-2k. Starting with a monolithic die 1, a silicon substrate 3 having a thickness of about 700 µm is provided. In this embodiment, the silicon substrate 3 is heavily doped with N-type dopants with a doping concentration in a range of $1.22 \times 10^{-19}$ to $8.19 \times 10^{-19}$ atoms/cm$^3$. The epitaxial layer 2, having a thickness of about 40 µm, is grown on the upper side of the silicon substrate 3, in which the epitaxial layer has a doping concentration in a range of $1.56 \times 10^{-16}$ to $4.95 \times 10^{-15}$ atoms/cm$^3$. The selection of the N-type dopants may include, for example, arsenic or phosphorous. Before fabricating the circuit element 6 of the die, the isolation trench 16 is excavated from the top surface of the epitaxial layer 2 in the non-active region 120 by using photoresist and photo patterning processes to a depth of around 70 µm, and the width of the isolation trench 120 is around 1.2 µm. The isolation trench 16 is then filled with dielectric material 4, such as silicon dioxides through chemical vapor deposition (CVD), as illustrated in FIG. 2a. In this embodiment, more than one isolation trench can be formed using the same photolithography process.

Figure 2B:
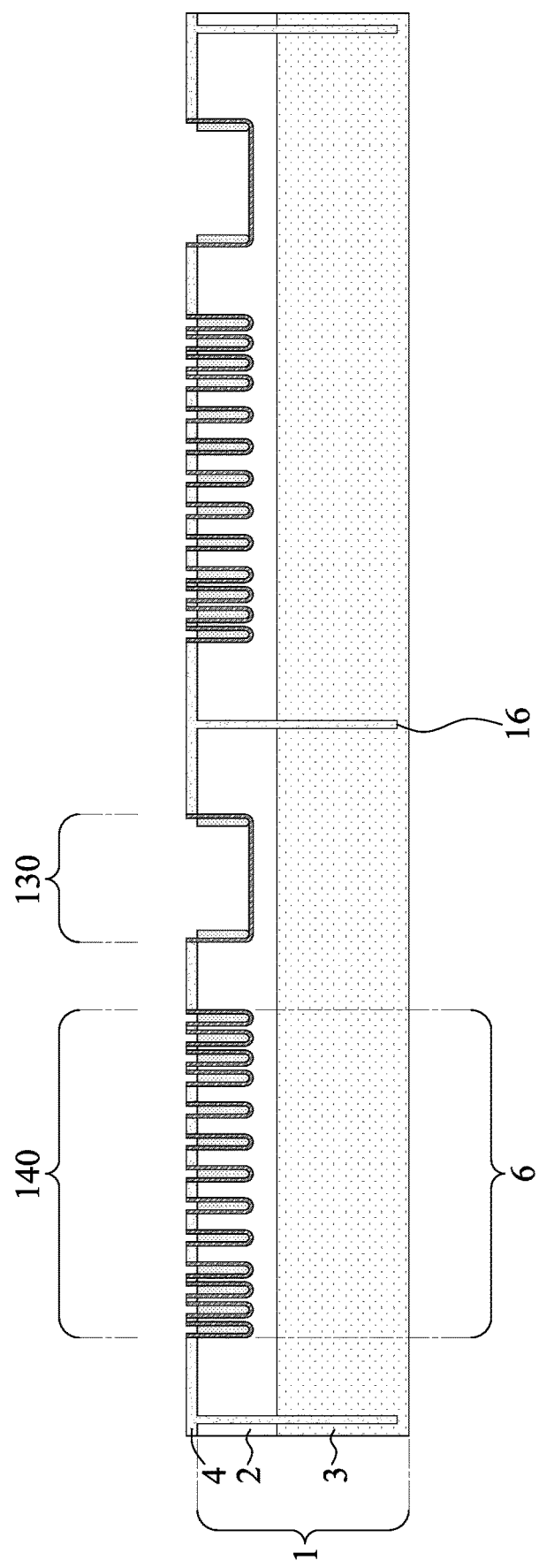
Figure 2C:
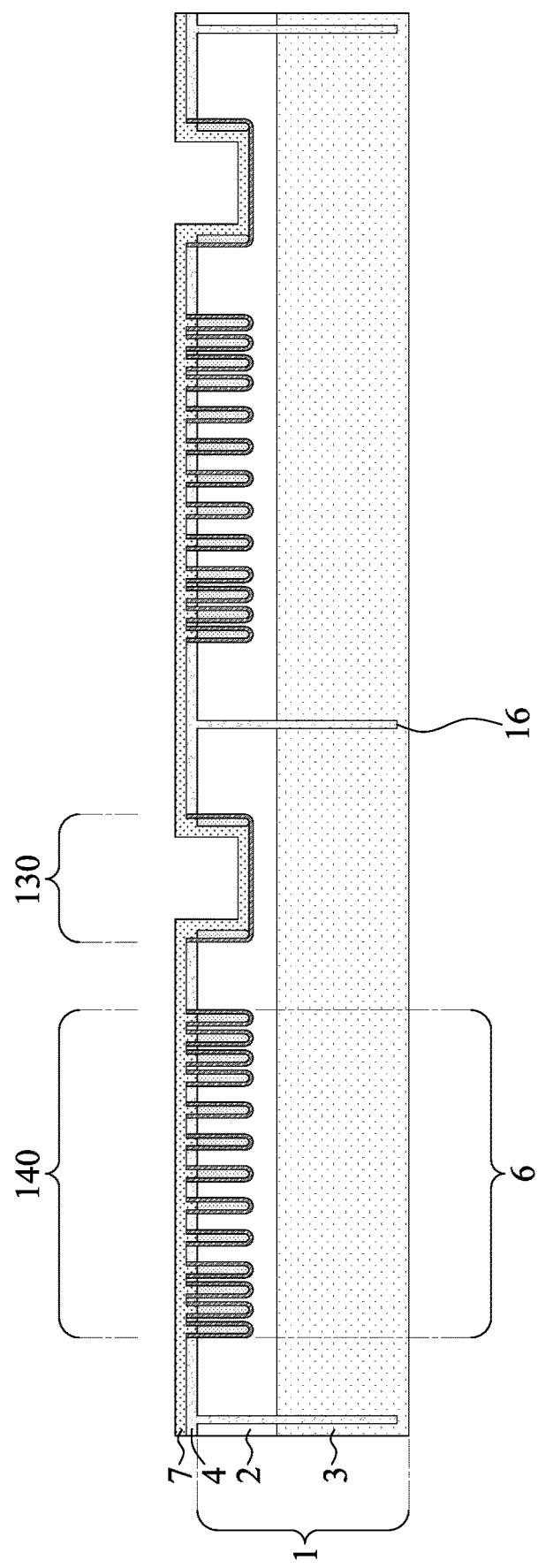

Circuit elements 6 are then fabricated in the way embedded in and on the epitaxial layer 2 of the active region 110. In this embodiment, schottky trenched diodes is fabricated by using photolithography technique where a series of treatment including photoresist application, light exposure, selective etching, photoresist removal and trench etching is performed, resulting in an array of trench in the anode region 140 and cathode region 130. A layer of gate oxide may be formed along the wall of the trenches by thermal oxidation. Then, polysilicon is deposited using CVD so as to fill the trenches as formed in the anode region 140, as illustrated in FIG. 2b. A polysilicon etch-back is performed thereafter to remove the excess portion of the polysilicon, while a layer of polysilicon may be retained around the wall of the trench in the cathode region 130. An interlayer dielectric (ILD) 7 is then deposited on at least a portion of the surface of the semiconductor die 1, as shown in FIG. 2c.

Figure 2D:
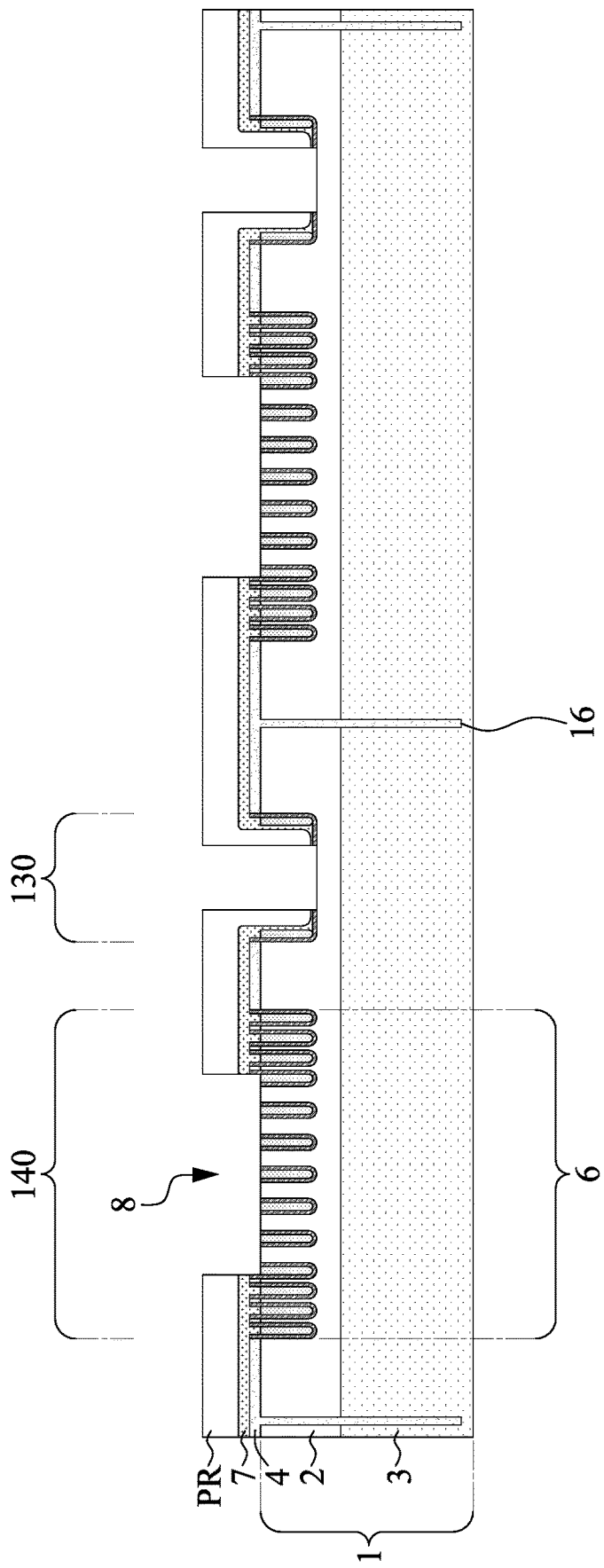

As illustrated in FIG. 2d, a photoresist (PR) is applied on the ILD layer 7. Followed by light exposure and selective etching, a recess of the anode region 8 is formed. The photoresist is removed upon the formation of the anode recess 8.

Figure 2E:
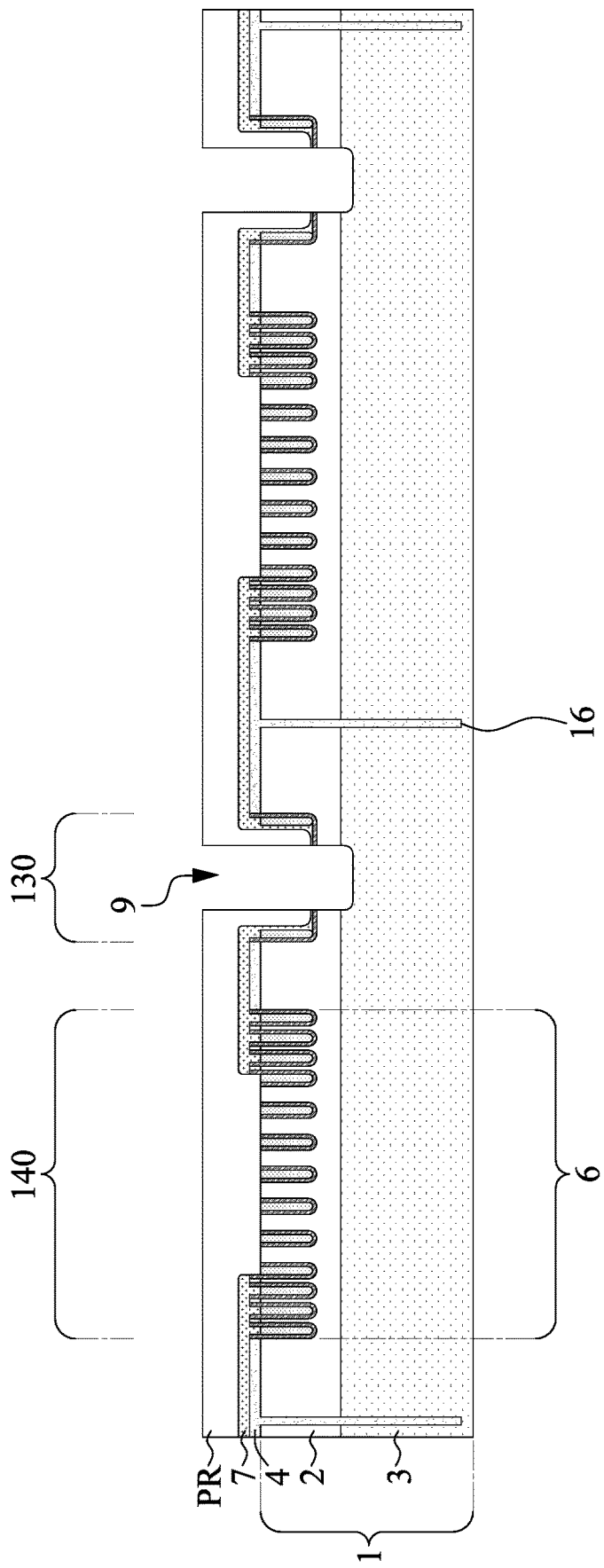

As illustrated in FIG. 2e, another photoresist (PR) is applied on the ILD layer 7. Followed by light exposure and selective etching, a recess of the cathode region 9 is formed. The photoresist is removed upon the formation of the cathode recess 9.

In this embodiment, the bottom of the anode recess 8 reaches the surface of the epitaxial layer 2, while the bottom of the cathode recess 9 reaches the surface of the substrate 3. In some embodiments of the present invention, the bottom of the cathode 9 recess may lie above the substrate 3.

Figure 2F:
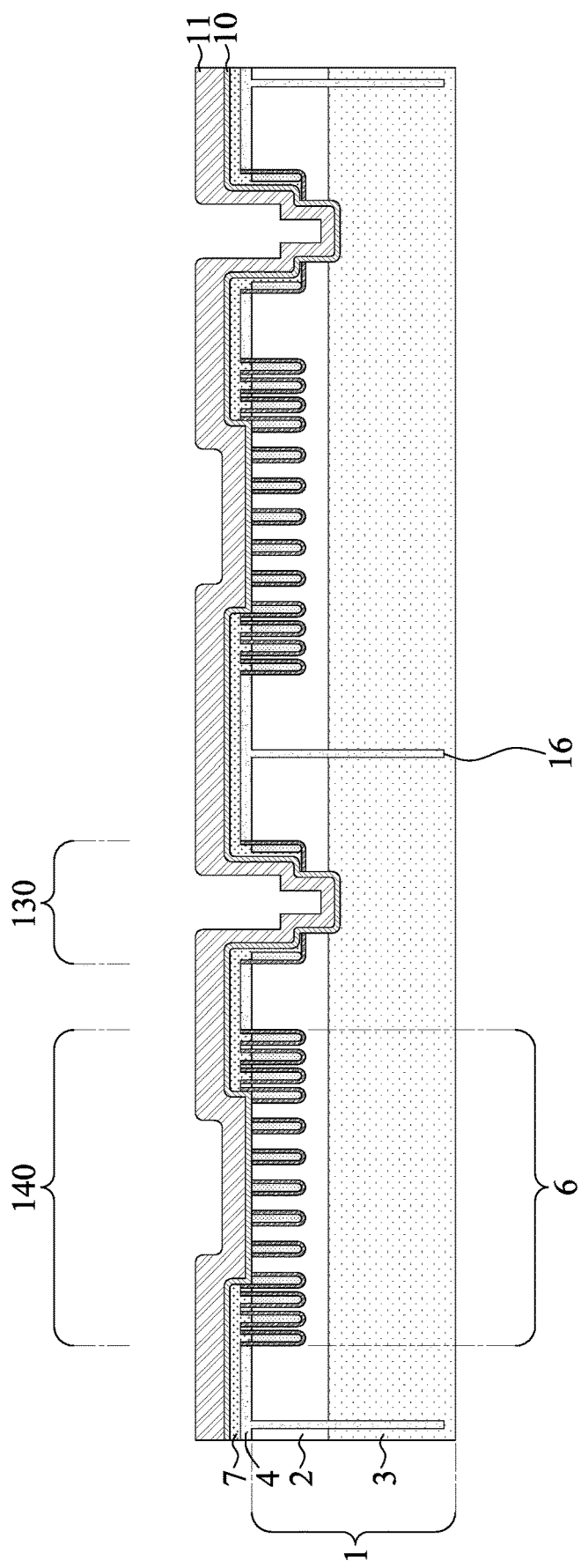

A first metal layer 10 is then formed complying with the topology of the die surface resulted from the previous processes. The first metal layer 10, e.g. using Titanium sputtering, can form schottky junction at the anode recess 8 and form ohmic junction at the cathode recess 9. Further treatment such as a rapid thermal process (RTP) may be further applied to the first metal layer 10. A second metal layer 11, e.g. using AlSiCu sputtering, is then formed on the first metal layer 10 for electrical interconnection amongst different isolated dies (as will be shown in the later stage). A cross-sectional view at this stage is shown in FIG. 2f.

Figure 2G:
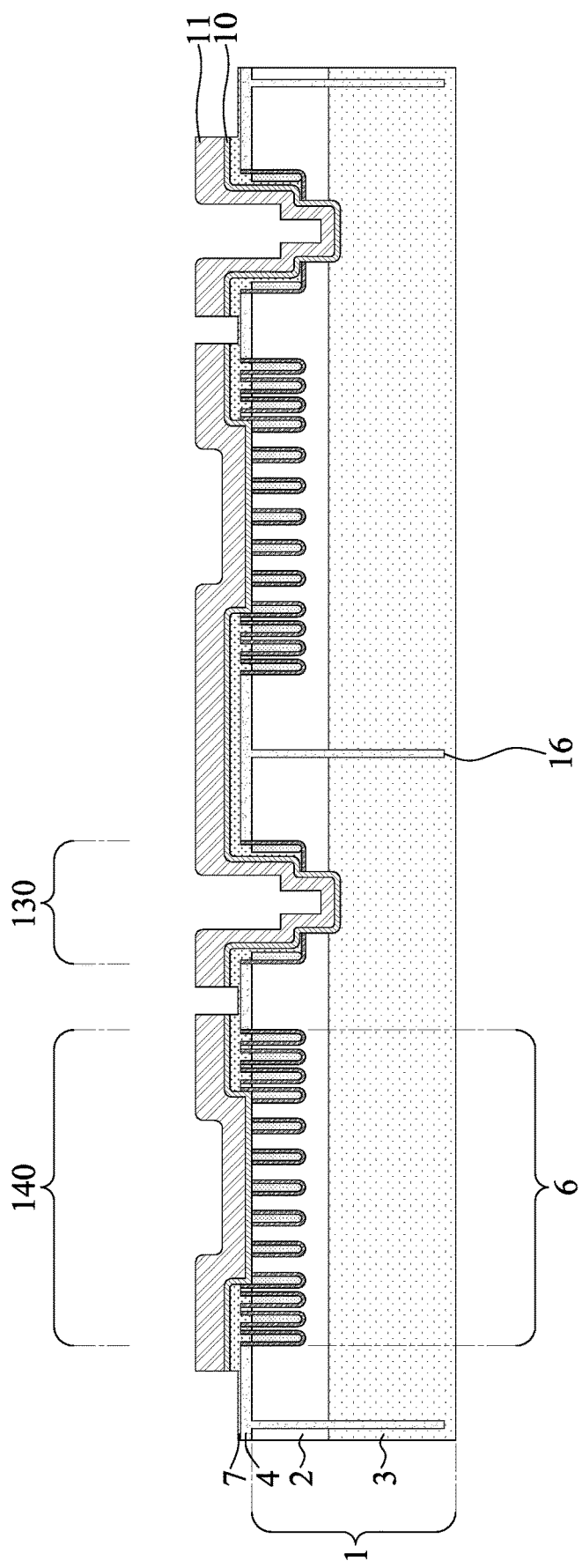

As shown in FIG. 2g. the second metal layer 11 and 10 are then patterned as desired using photolithography technique including photoresist application, selective etching and photoresist removal. A sintering process may be further conducted to adjust the energy barrier height of the schottky junction.

Figure 2H:
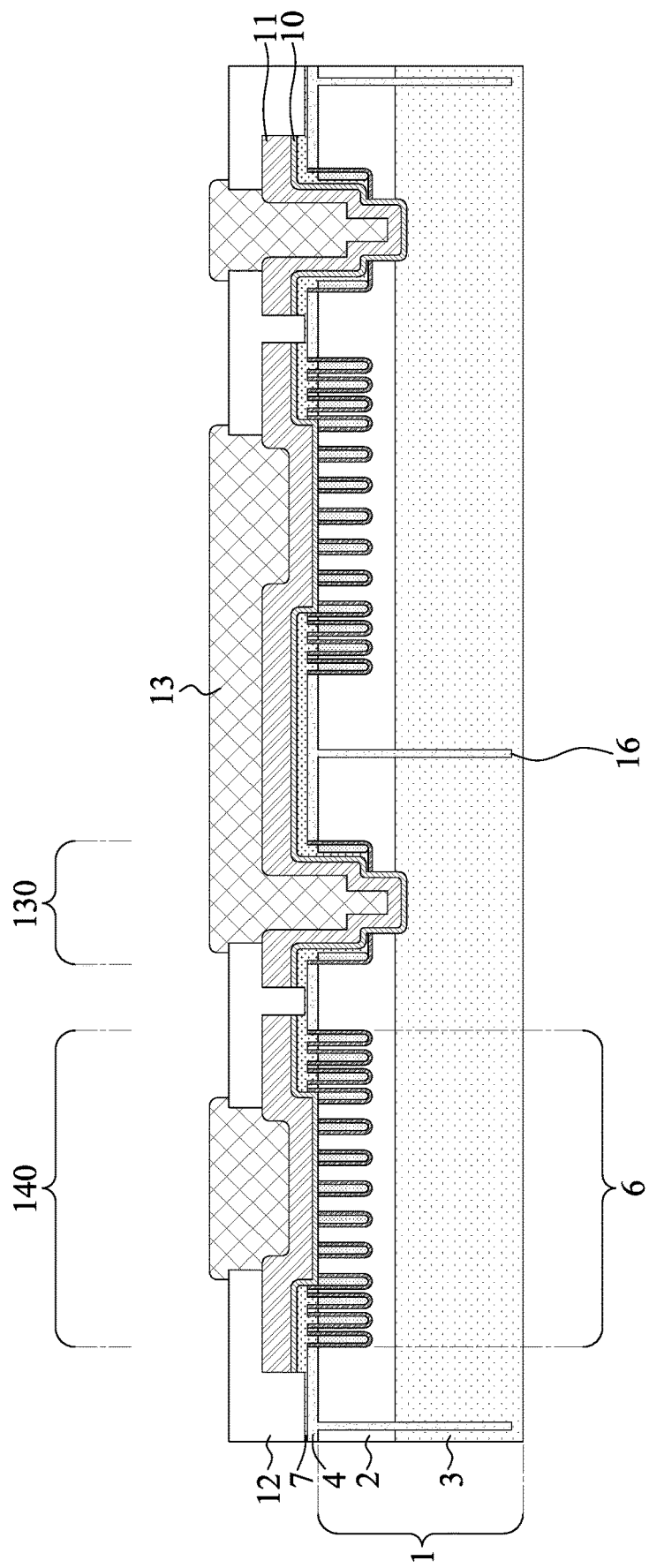

As shown in FIG. 2h, a passivation layer 12, e.g., polyimide, is applied on or around at least a portion of the second metal layer 11 to protect the circuit elements. The pattern of the passivation layer 12 can be achieved by using photolithography technique. A third metal layer 13 is then applied on the portion of the die surface designated for connecting the soldering material (not shown in the figures). The third metal layer 13 can be a chemical plating layer so that the photolithography process is not needed for forming the intended pattern. For example, a composite layer of Ni/Au can be selected as the material of the third metal layer 13.

Figure 2I:
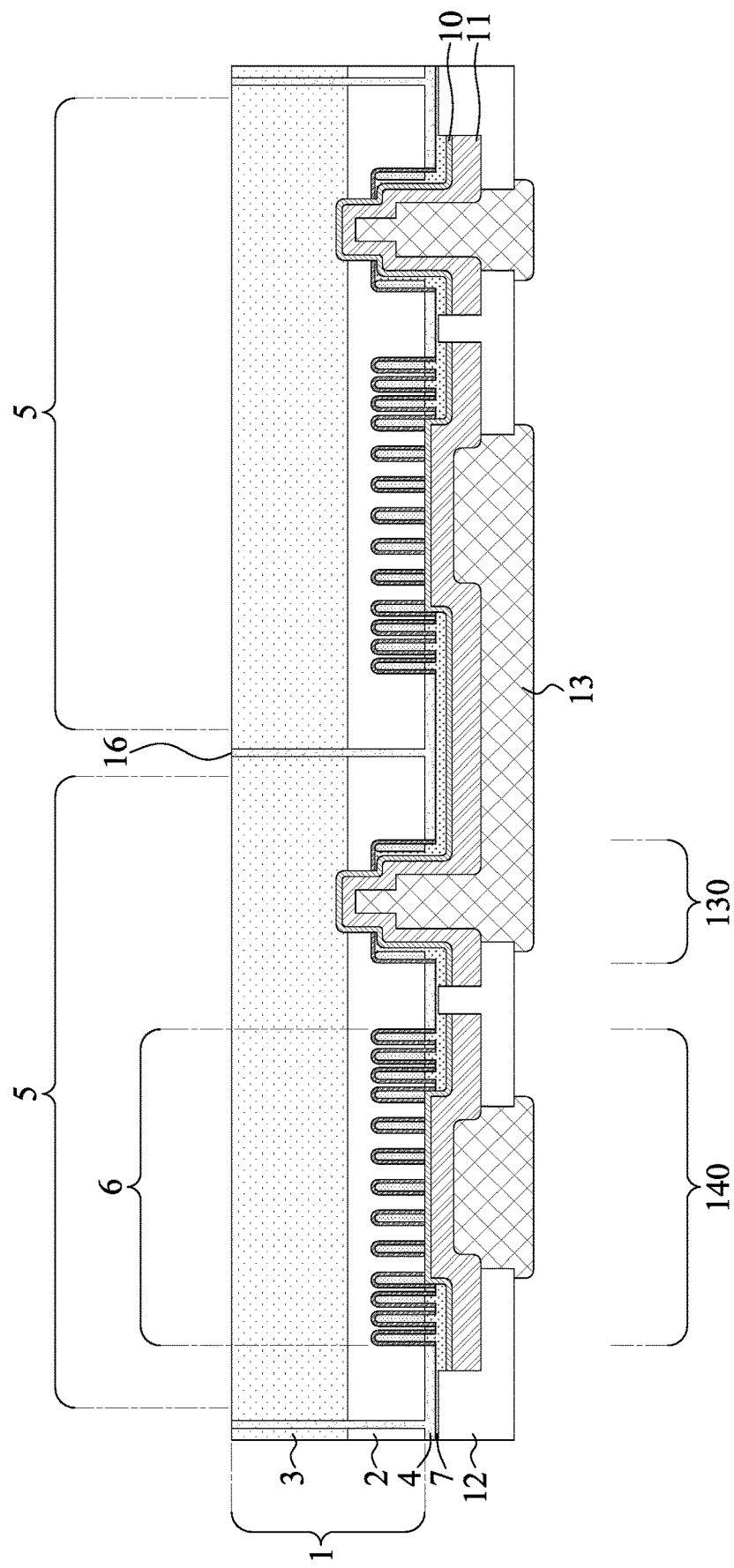
Figure 2J:
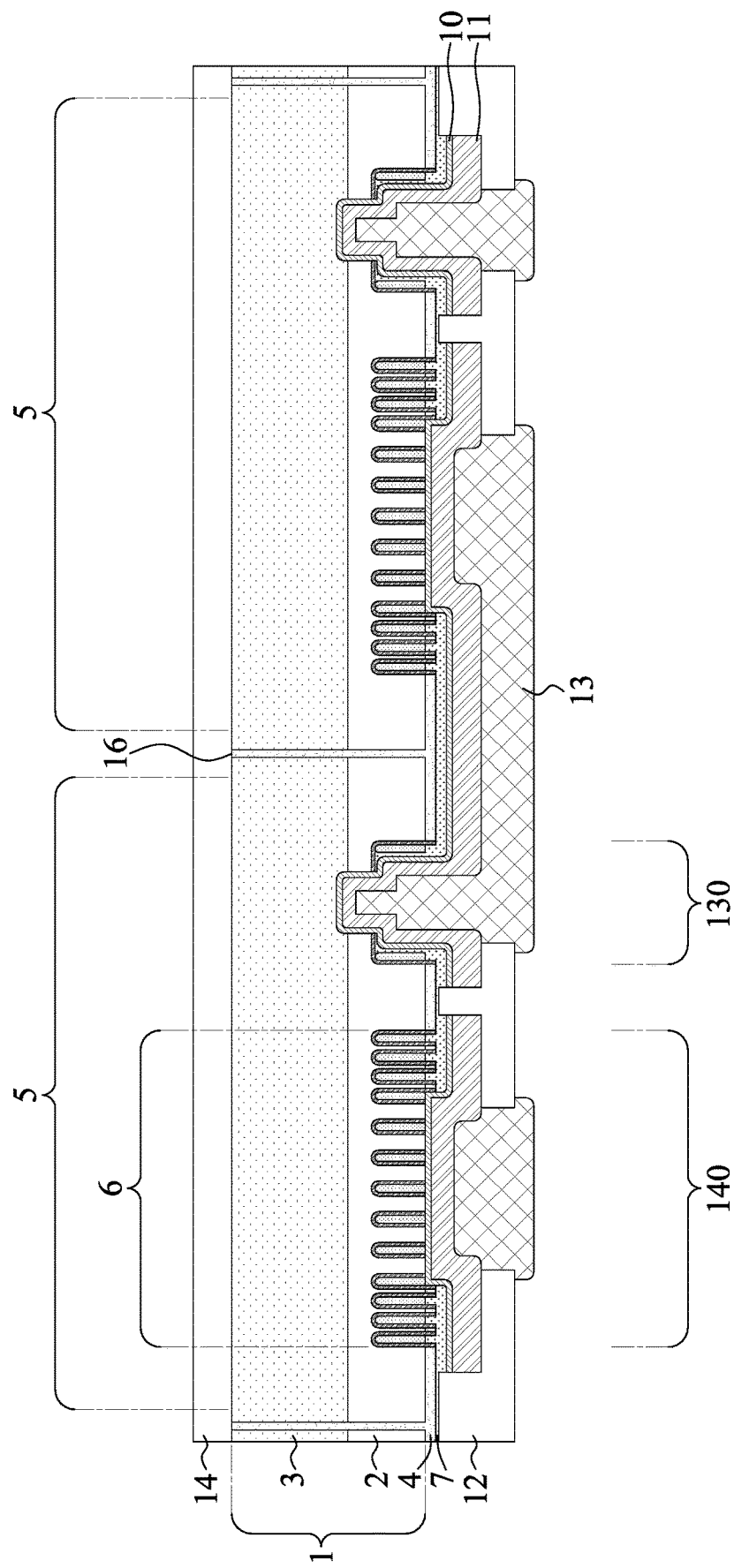
Figure 2K:
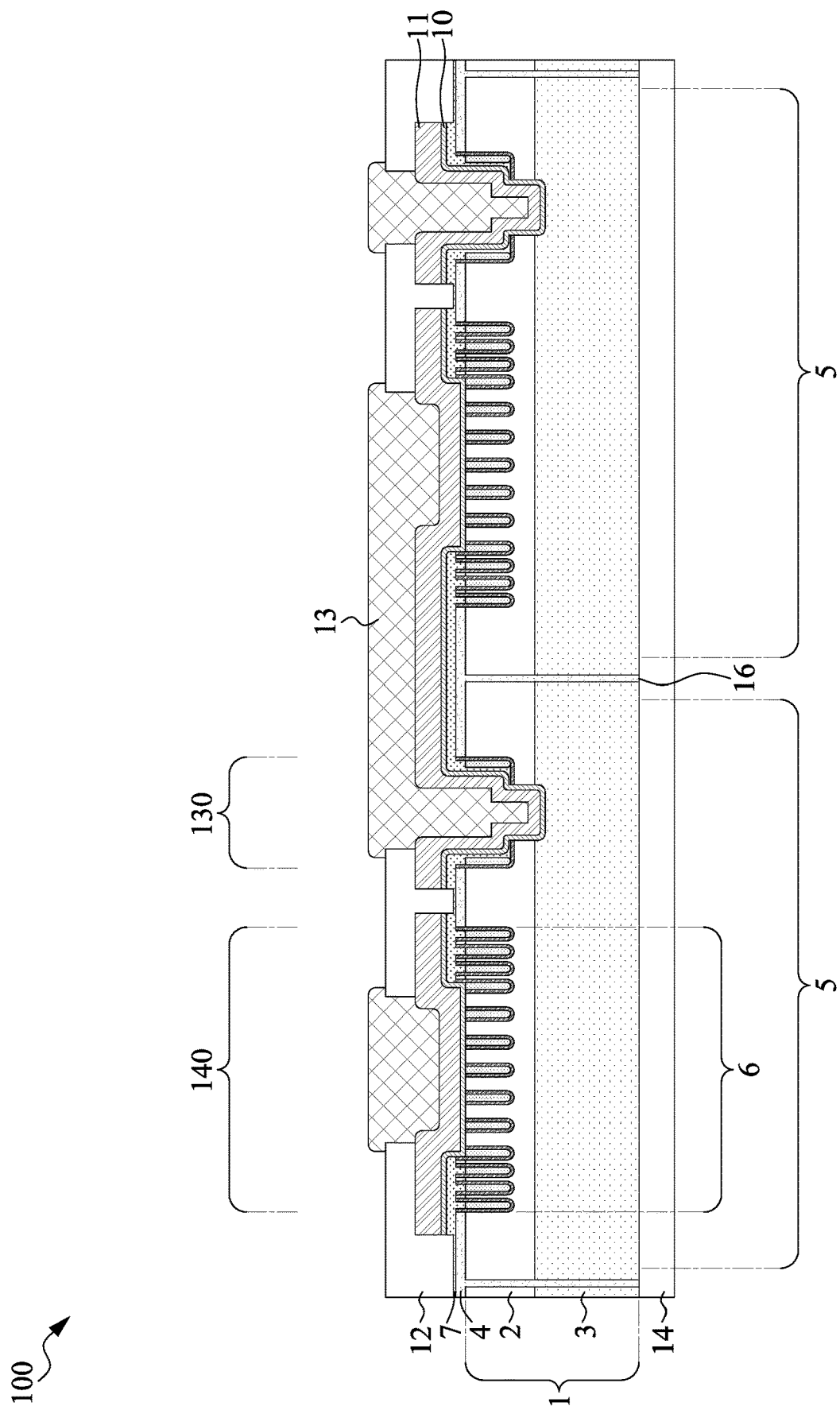

After completing the front-end process, the semiconductor die 1 is flipped over for backend processing. As shown in FIG. 2i, a back grinding process takes place which thins the die until the exposure of the dielectric layer 4 and thereby separates the monolithic die into isolated semiconductor dies 5. Each isolated semiconductor dies are then encapsulated with molding compound 14, such as epoxy resin, on its four sides and bottom, as illustrated in FIG. 2j. The final form of the semiconductor device of this embodiment 100 is illustrated in FIG. 2k. The semiconductor device will be sawed for singulation and further testings.

Figure 3:
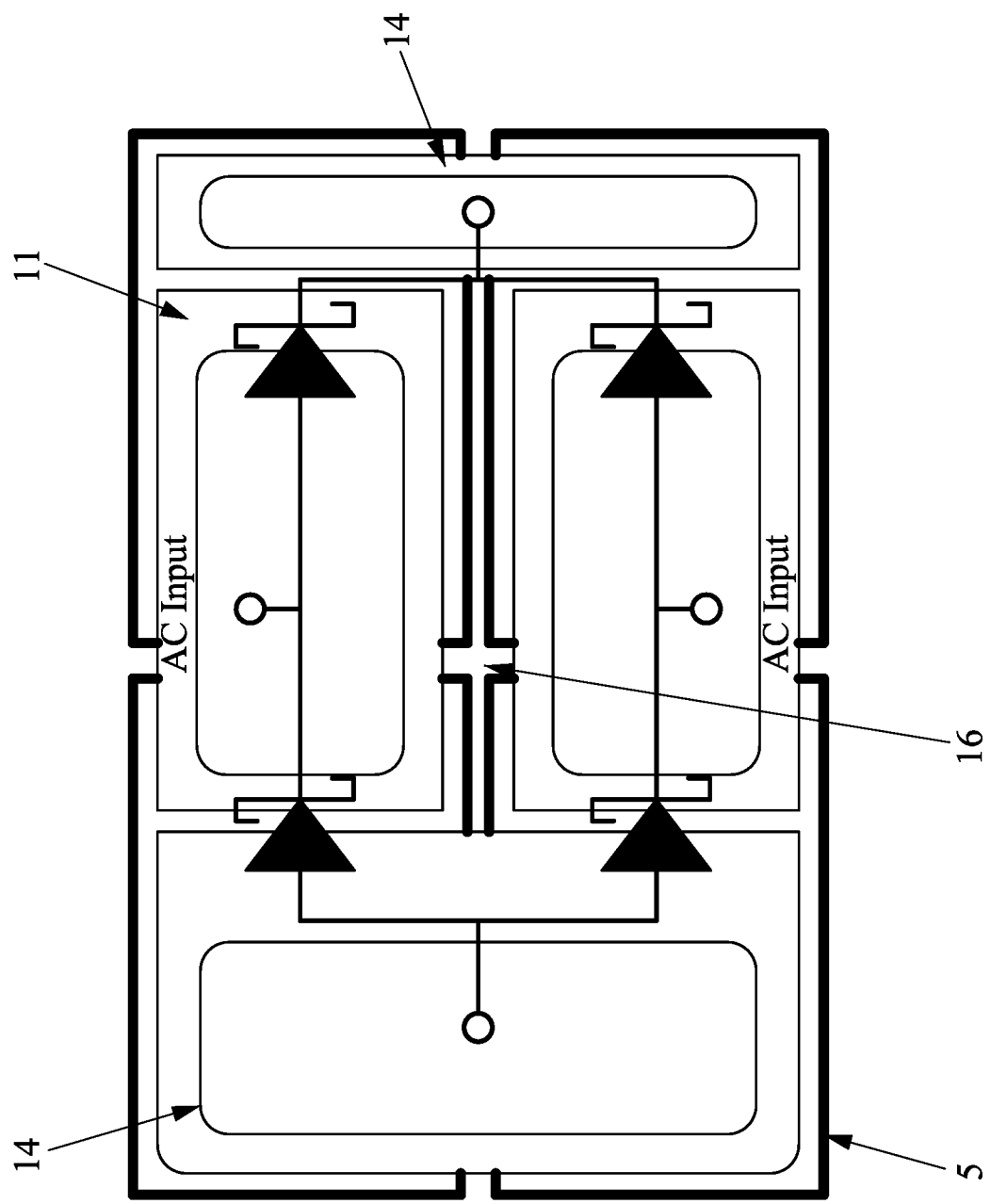
FIG. 3 provides a circuit layout of the circuit elements employed in the embodiments of the present invention.

Referring to FIG. 3, a circuit layout where four diodes (i.e., isolated dies 5) electrically connected to serve as a bridge rectifier is illustrated. It should be noted that other class of circuit and circuit element can be adopted and benefit from the present invention.

Figure 4A:
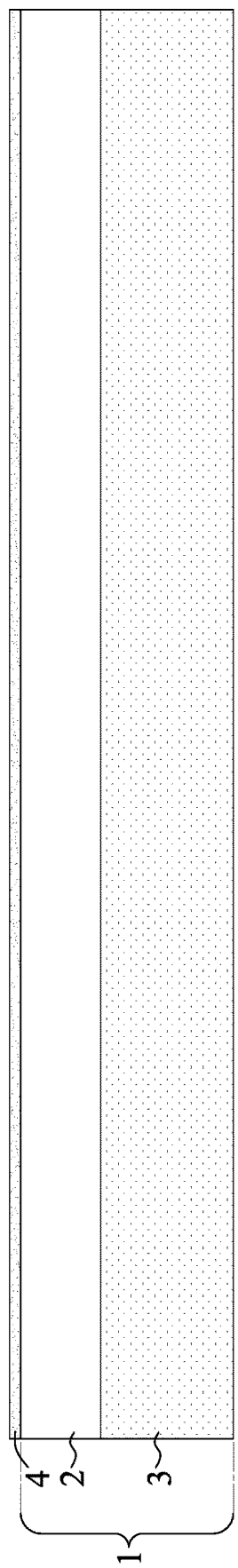
FIG. 4a-4k provides a demonstration of the manufacturing process according to the semiconductor device of the second embodiment.
Figure 4B:
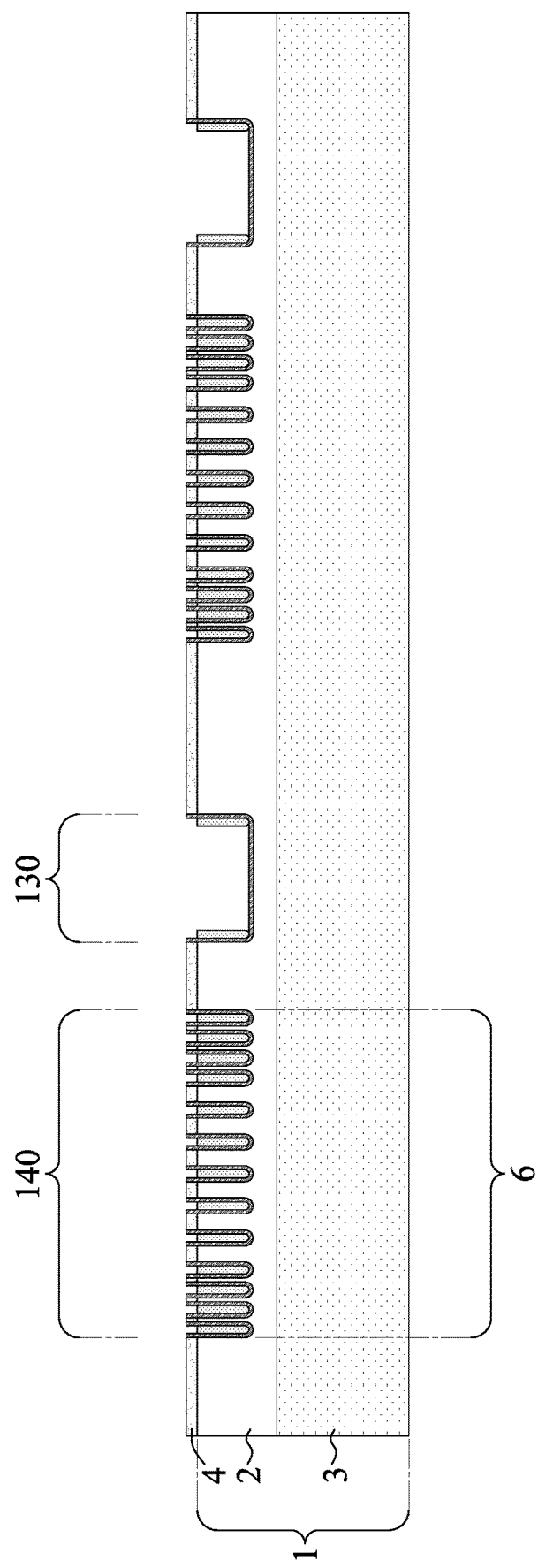
Figure 4C:
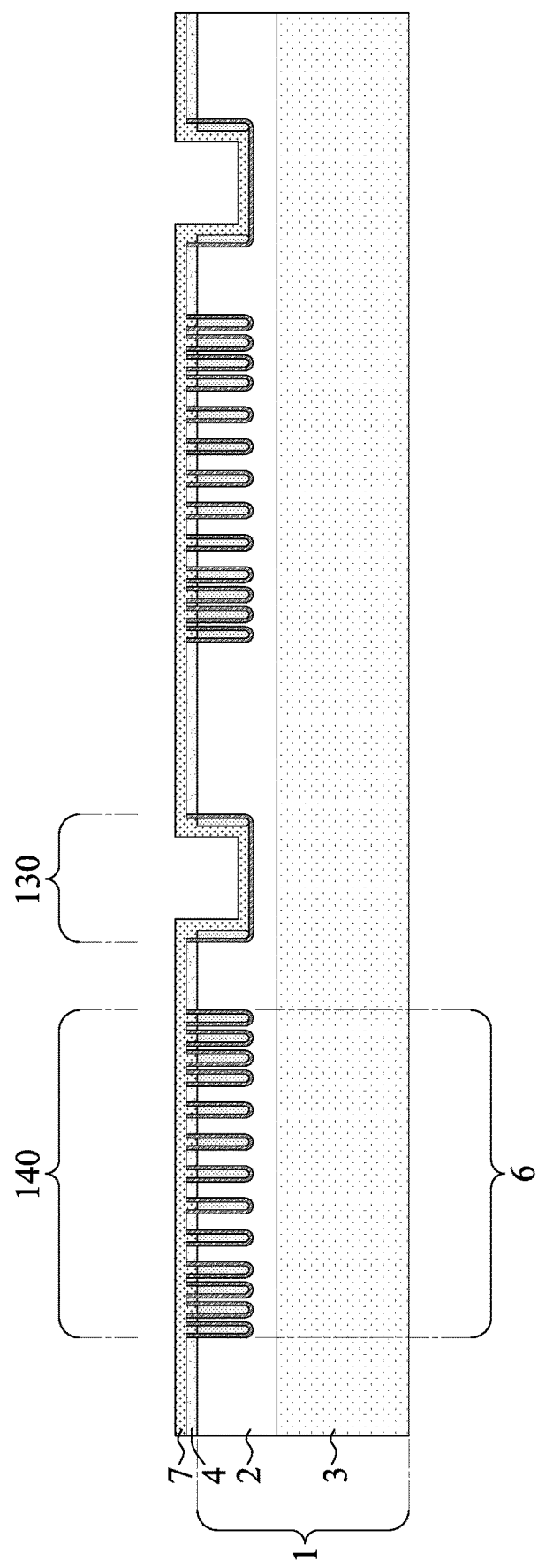

Referring to the second embodiment as shown in FIG. 4a-4k. A monolithic die having a substrate 3 grown on its top with an epitaxial layer 2 is prepared. Circuit elements 6 are formed in the way embedded in and on the epitaxial layer. The fabrication process of the circuit element is illustrated as follows. In this embodiment, schottky trenched diodes is fabricated by using photolithography technique where a photoresist is firstly applied on the surface of the layer 4, as shown in FIG. 4a. Followed by light exposure, selective etching, photoresist removal and trench etching, an array of trench in the anode region 140 and cathode region 130 is formed. A layer of gate oxide may be further formed along the wall of the trenches by thermal oxidation. Then, polysilicon is deposited using CVD so as to fill the trenches as formed in the anode region 140, as illustrated in FIG. 4b. A polysilicon etch-back is performed thereafter to remove the excess portion of the polysilicon. An interlayer dielectric (ILD) 7 is then deposited on at least a portion of the surface of the semiconductor die 1, as shown in FIG. 4c.

Figure 4D:
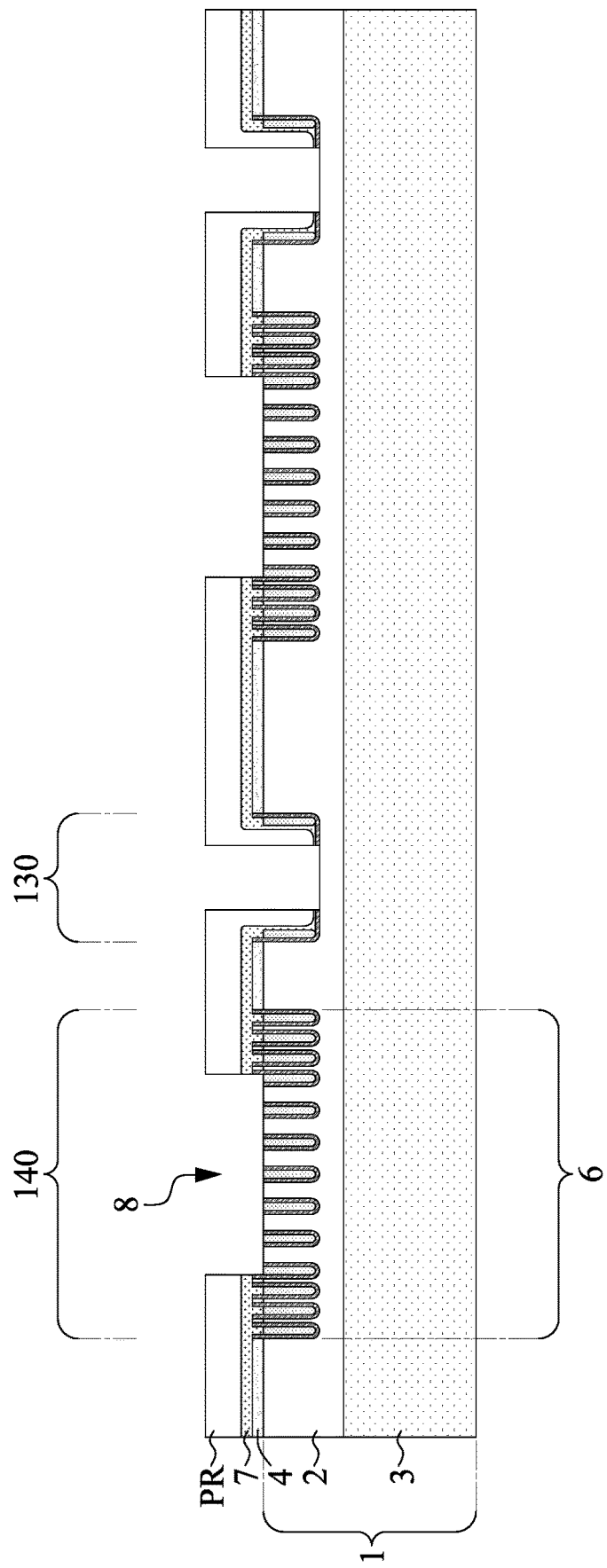

As illustrated in FIG. 4d, a photoresist (PR) is applied on the ILD layer 7. Followed by light exposure and selective etching, a recess of the anode region 8 is formed. The photoresist is removed upon the formation of the anode recess.

Figure 4E:
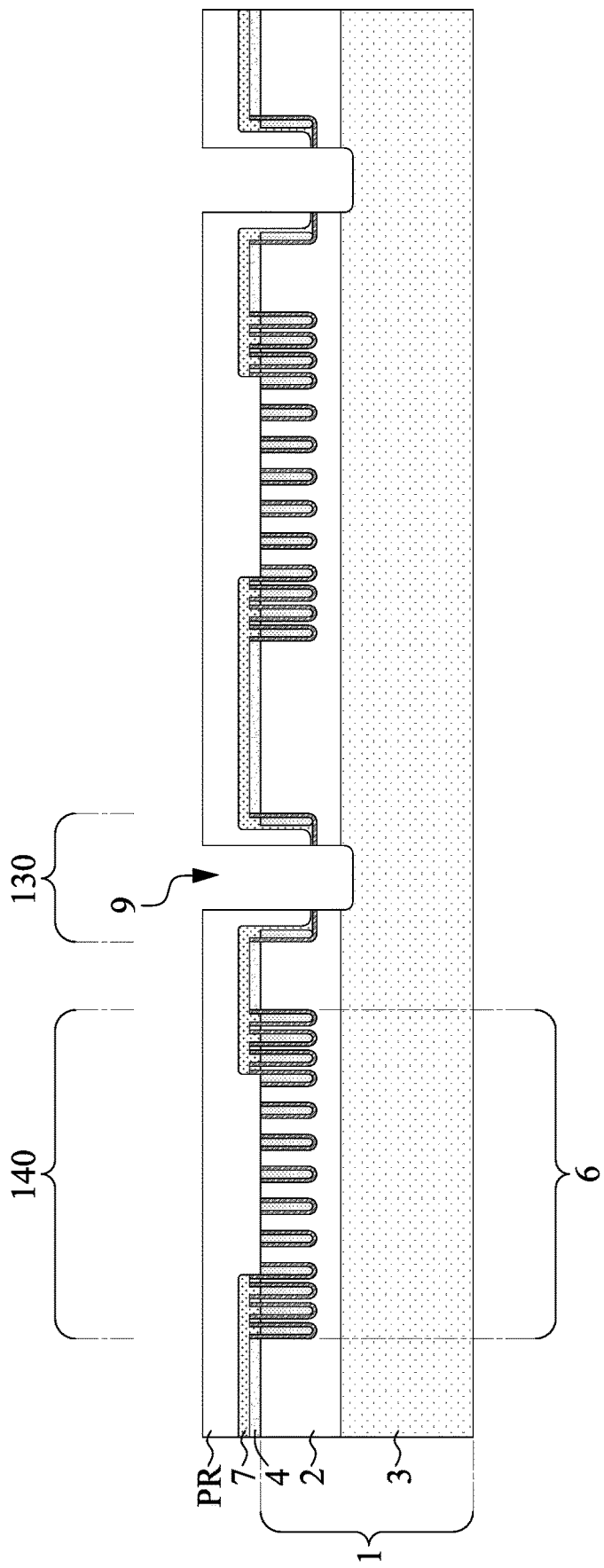

As illustrated in FIG. 4e, another photoresist (PR) is applied on the ILD layer 7. Followed by light exposure and selective etching, a recess of the cathode region 9 is formed. The photoresist is removed upon the formation of the cathode recess.

In this embodiment, the bottom of the anode recess 8 reaches the surface of the epitaxial layer 2, while the bottom of the cathode recess 9 reaches the surface of the substrate 3. In some embodiments of the present invention, the bottom of the cathode 9 recess may lie above the substrate 3.

Figure 4F:
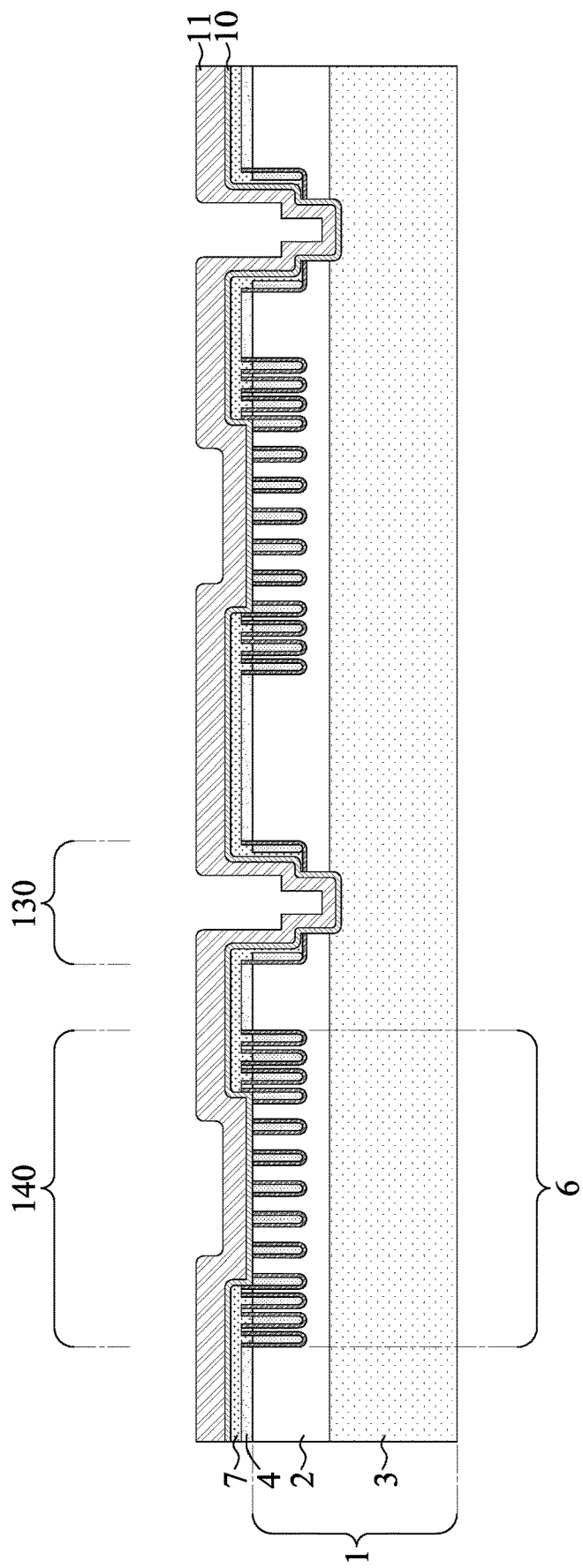

A first metal layer 10 is then formed complying with the topology of the die surface resulted from the previous processes. The first metal layer 10, e.g. using Titanium sputtering, can form schottky junction at the anode recess 8 and form ohmic junction at the cathode recess 9. Further treatment such as a rapid thermal process (RTP) may be further applied to the first metal layer 10. A second metal layer 11, e.g. using AlSiCu sputtering, is then formed on the first metal layer 10 for electrical interconnection amongst different isolated dies (as will be shown in the later stage). A cross-sectional view at this stage is shown in FIG. 4f.

Figure 4G:
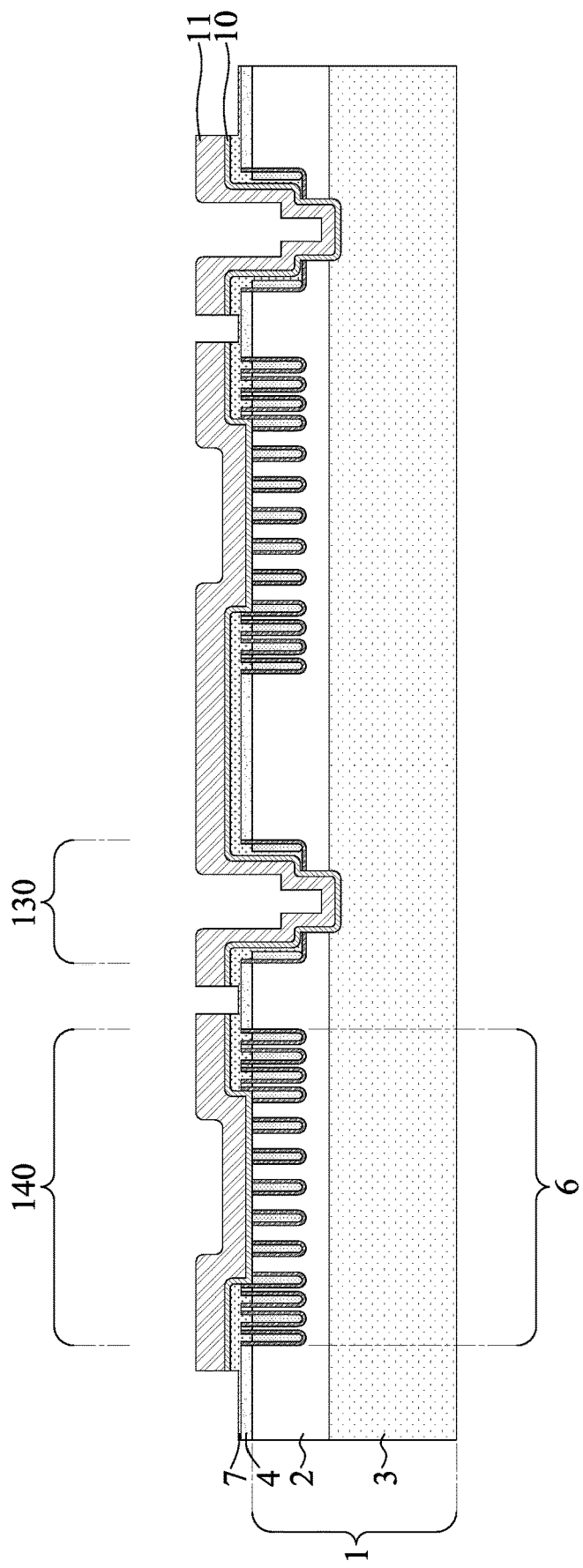

As shown in FIG. 4g, the second metal layer 11 and 10 are then patterned as desired using photolithography technique including photoresist application, selective etching and photoresist removal. A sintering process may be further conducted to adjust the energy barrier height of the schottky junction.

Figure 4H:
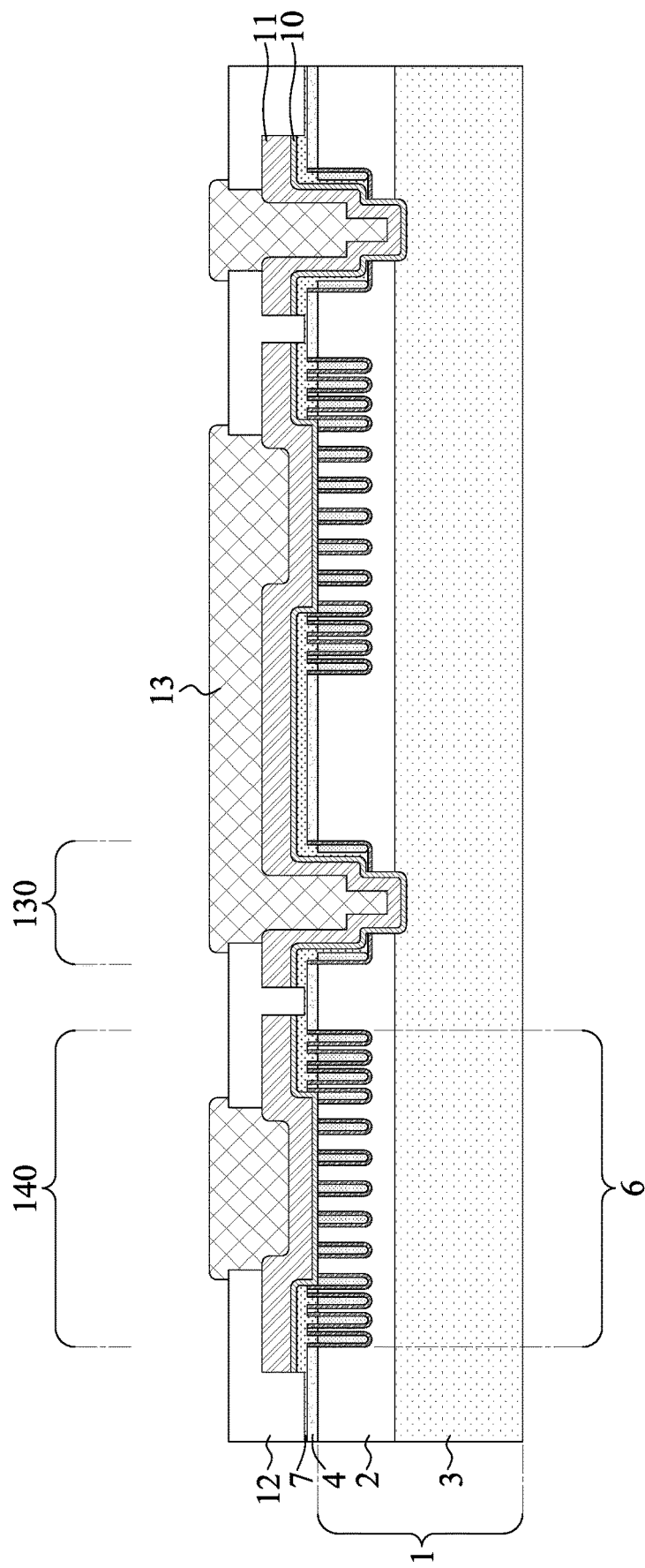

As shown in FIG. 4h, a passivation layer 12, e.g., polyimide, is applied on or around at least a portion of the second metal layer 11 to protect the circuit elements. The pattern of the passivation layer 12 can be achieved by using photolithography technique. A third metal layer 13 is then applied on the portion of the die surface designated for connecting the soldering material (not shown in the figures). The third metal layer 13 can be a chemical plating layer so that the photolithography process is not needed for forming the intended pattern. For example, a composite layer of Ni/Au can be selected as the material of the third metal layer 13.

Figure 4I:
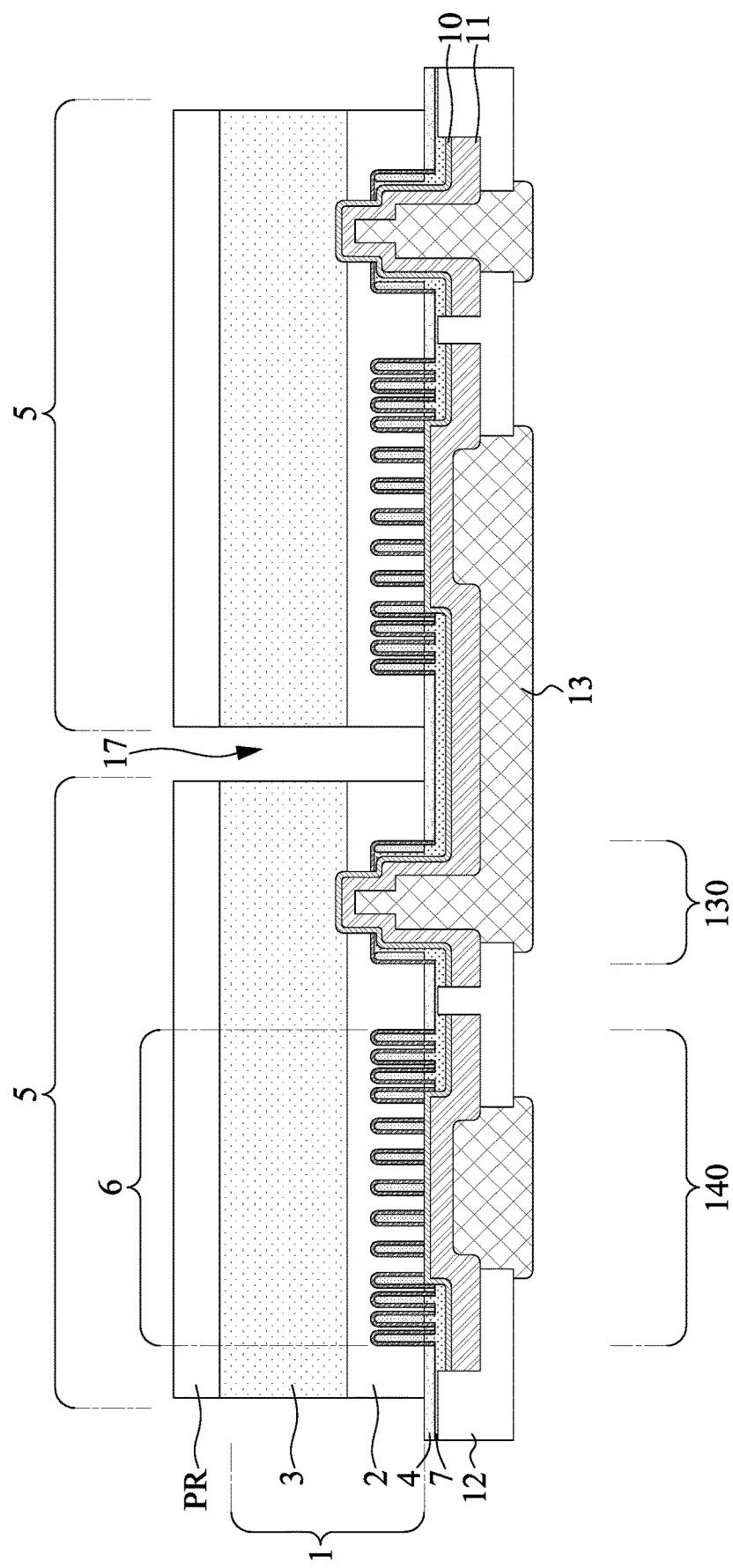
Figure 4J:
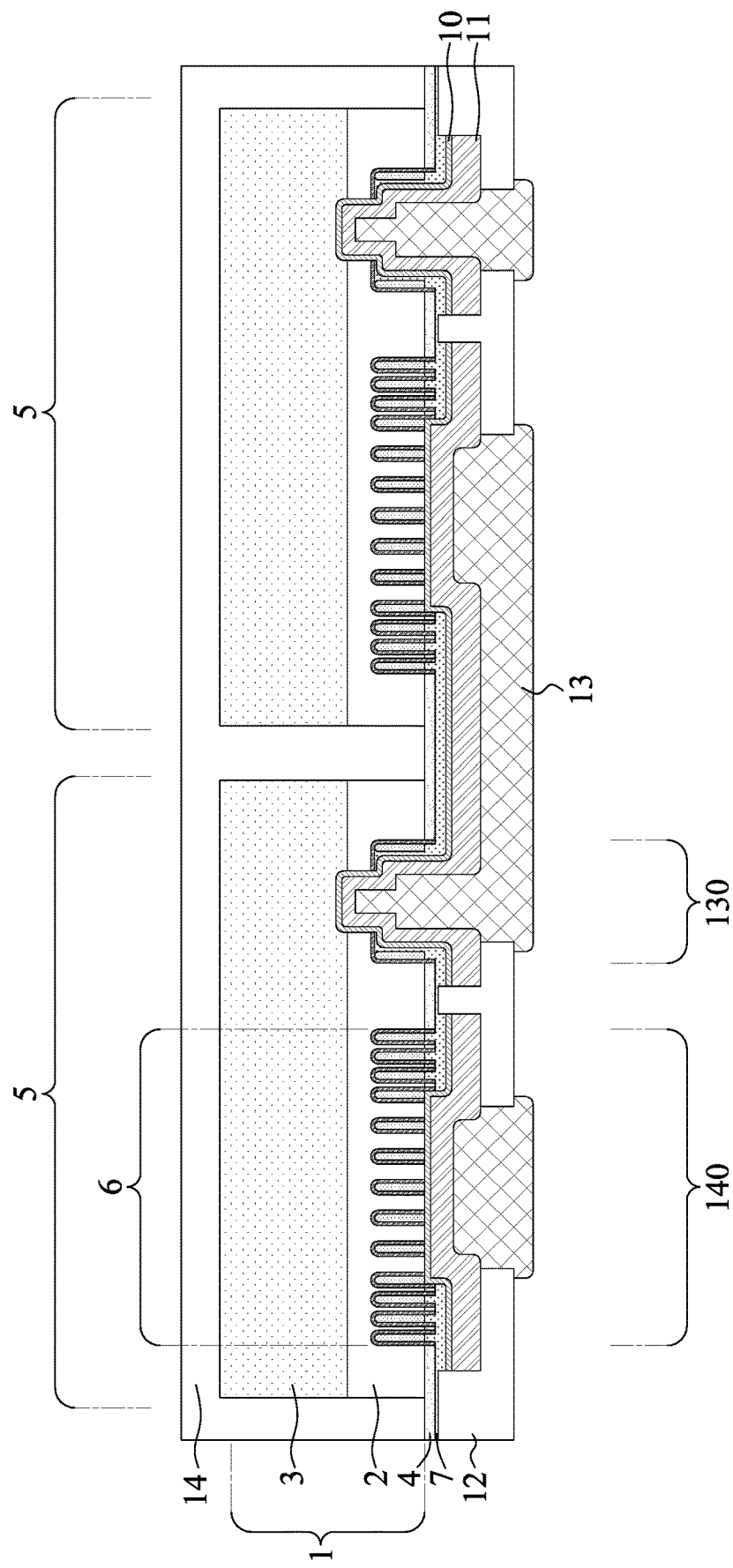
Figure 4K:
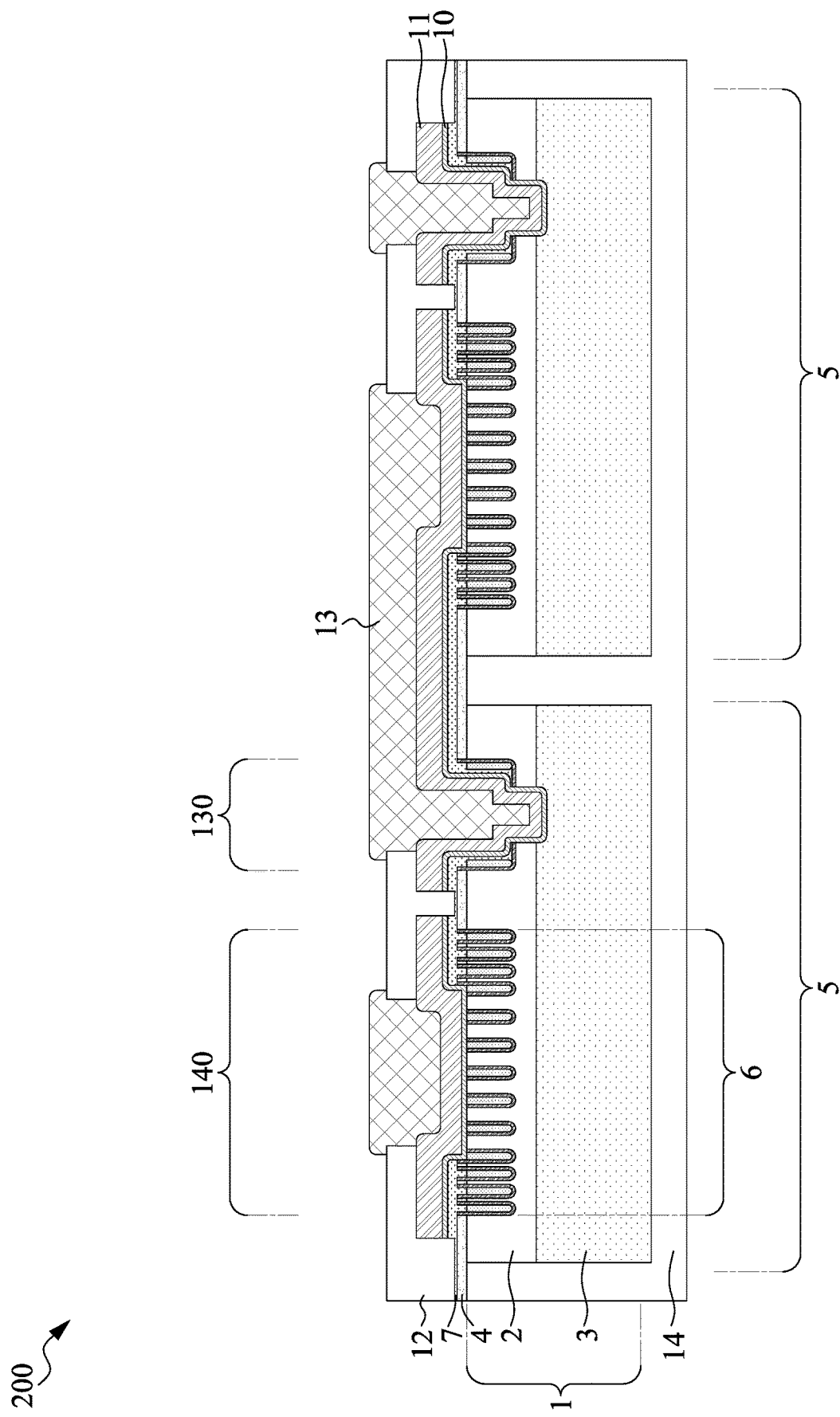

It should be noted that no front-end etching process is performed on the non-active region in the second embodiment. After completing the front-end process, the semiconductor die 1 is flipped over, and a back grinding process takes place that thins the die to a thickness of around 70 μm. Then, a back-end etching process, such as plasma etching or sawing, is used to form the isolation trench 17 which is excavated from backside of the die to the ILD layer 7 on the front side of the die and thereby separating the monolithic die into isolated semiconductor dies 5. In the situation where the plasma etching process is employed, the plasma etching process is carried out along with the photolithography technique to form the isolation trench 17 at the designated portion of the non-active region 120. In this embodiment, a width of around 75 μm of the isolation trench 17 is formed with the plasma etching. An illustration of the above processing steps are shown in FIG. 4i. The molding compound 14, such as epoxy resin, is then applied to fill the isolation trench 17 and encapsulate the isolated dies 5 on its sides and bottom, as illustrated in FIG. 4j. The final form of the semiconductor package 200 of this embodiment is illustrated in FIG. 4k.

The front-end etching process is known to have its limitation in forming the deep trench. In general, advanced equipment will be needed if the trench with the depth of over 40 μm is intended. By forming the trench with back-end etching process rather than the front-end etching process, this embodiment is advantageous in the aspect to be free from the need of the advanced equipment.

Figure 5A:
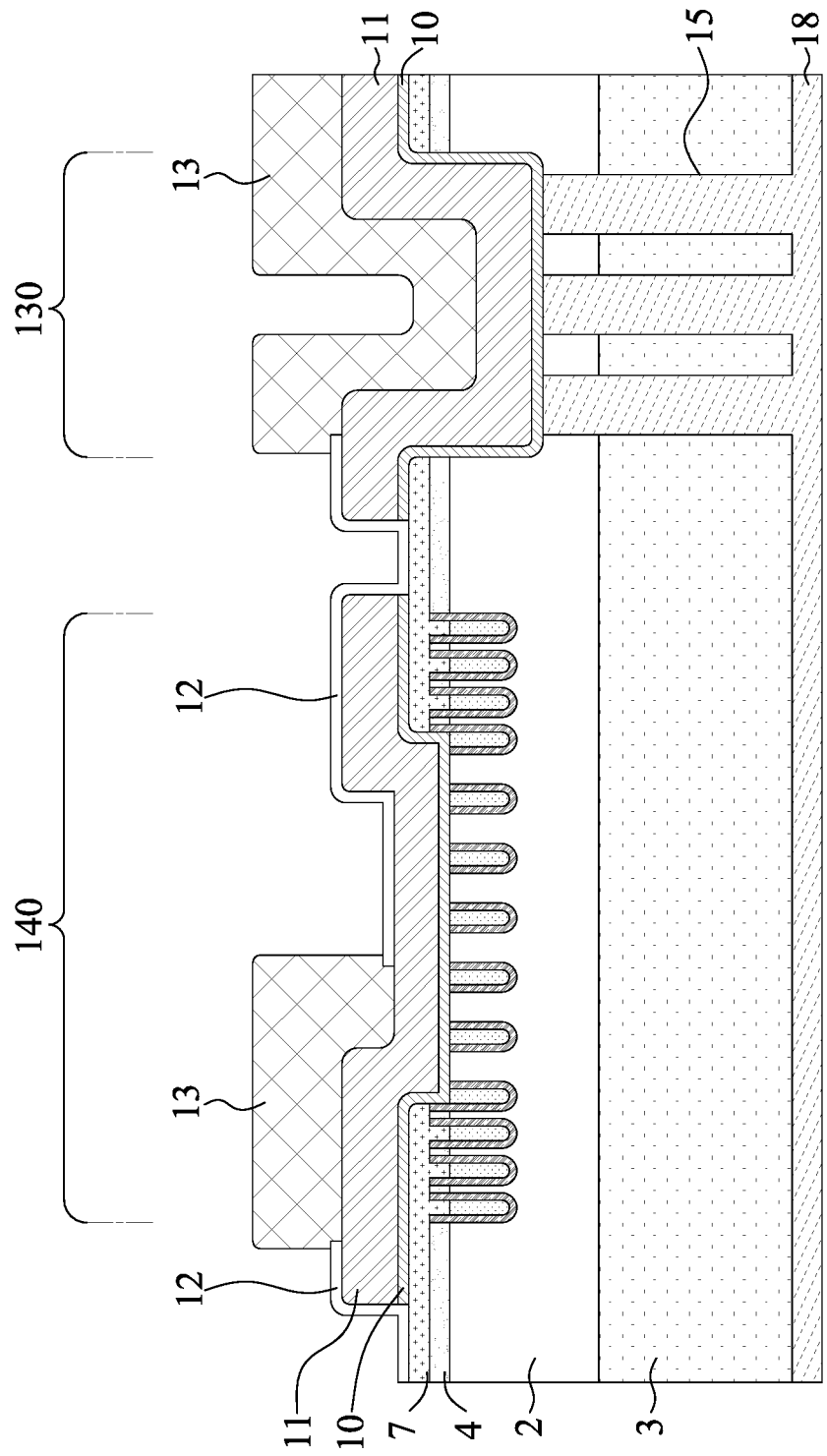
FIG. 5A and 5B provide a cross-sectional view of the circuit element having a channel structure as exemplified in the embodiments of the present invention.
Figure 5B:
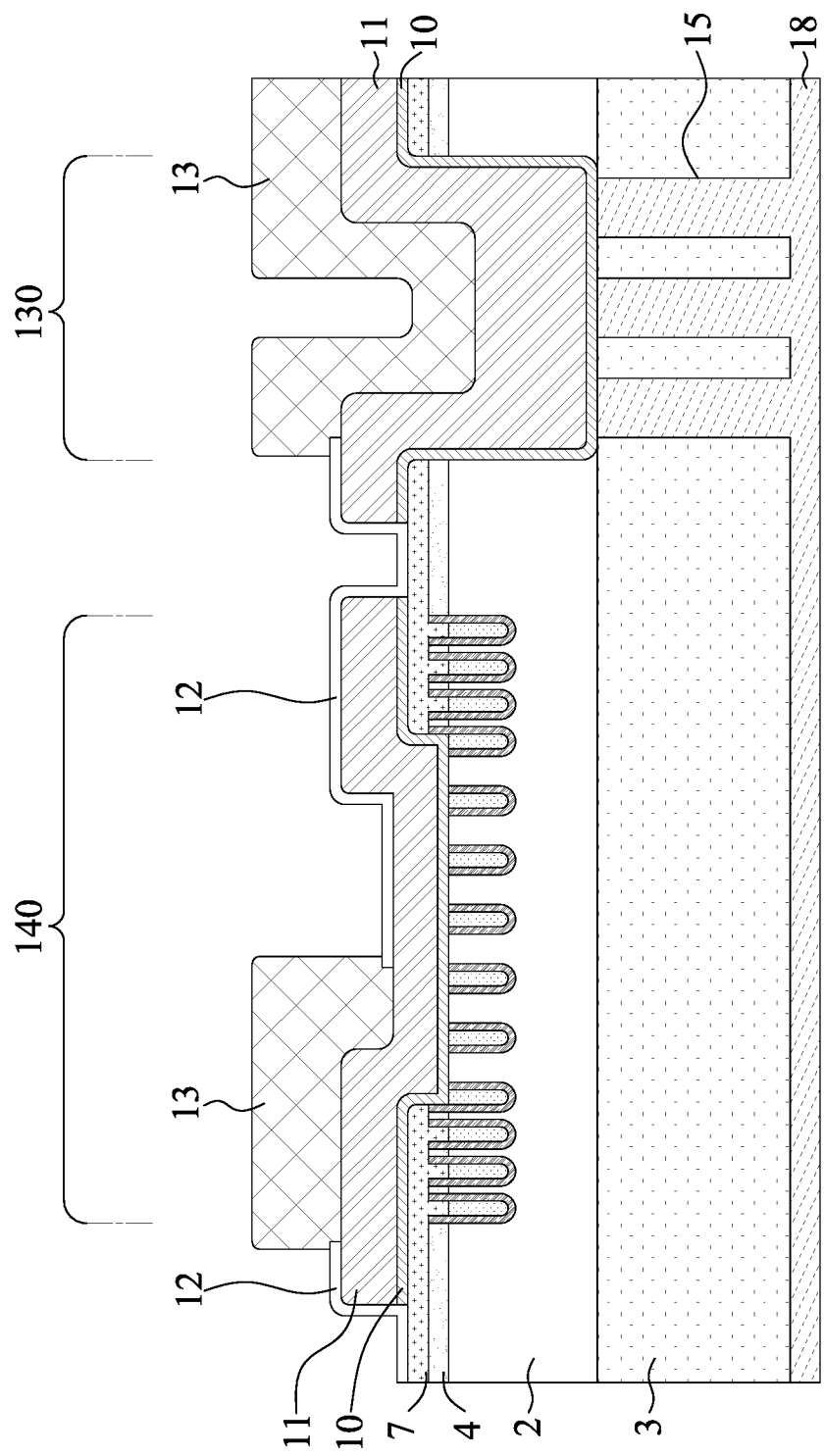

Referring to FIG. 5a, in some applications, a channel 15 filled with a fourth metal 18 is introduced in the cathode region 130 of the substrate, where the channel 15 is formed using the backside etching process (e.g., plasma etching) by excavating from the bottom of the substrate 3 up to the junction between the substrate 3 and the epitaxial layer 2. Alternatively, the channel 15 may extend up to the height protruded into the epitaxial layer 2, as illustrated in FIG. 5b. In either cases, the cathode recess 9 should be in conjunction with the fourth metal 18.

The channel 15 can be formed as a single channel or an array of channel as long they are resided under the cathode region 130 of the substrate. The shape of the channel 15 can be polygonally columnar or cylindrical. A fourth metal layer 18 is plated in the channel 15 and on the bottom surface of the substrate 3 after the formation of the channel. The process of forming the channel 15 and filling of the fourth metal 18 may be conducted prior to the formation of the isolation trench structure during the back-end etching process. By introducing the channel 15 filled with the fourth metal layer 18 in the cathode region 130 of the substrate, the forward voltage drop can be further improved.

Figure 6A:
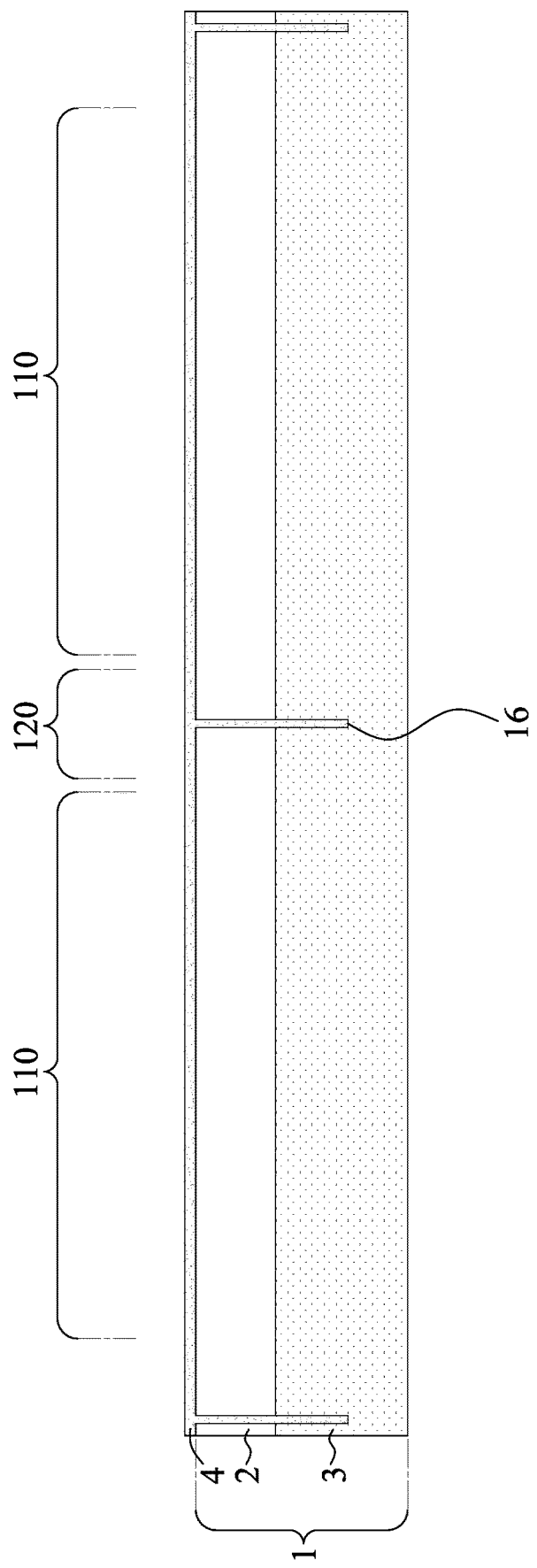
FIG. 6a-6k provides a demonstration of the manufacturing process according to the semiconductor device of the third embodiment.

Referring to the third embodiment as shown in FIG. 6a-6k. Before fabricating the circuit element 6 of the die, a first isolation trench 16 is excavated from the top surface of the epitaxial layer 2 in the non-active region 120 by using photoresist and photo patterning processes. The first isolation trench 16 is then filled with dielectric material 4, such as silicon dioxides through chemical vapor deposition (CVD), as illustrated in FIG. 6a. In this embodiment, more than one isolation trench can be formed using photolithography process.

In this embodiment, the first isolation trench 16 may be formed with a depth of around 40 μm and a width of around 1.2 μm. A first dielectric material 4, such as silicon dioxide or polysilicon, is filled into the first isolation trench 16 and thus forms a first isolation structure.

Figure 6B:
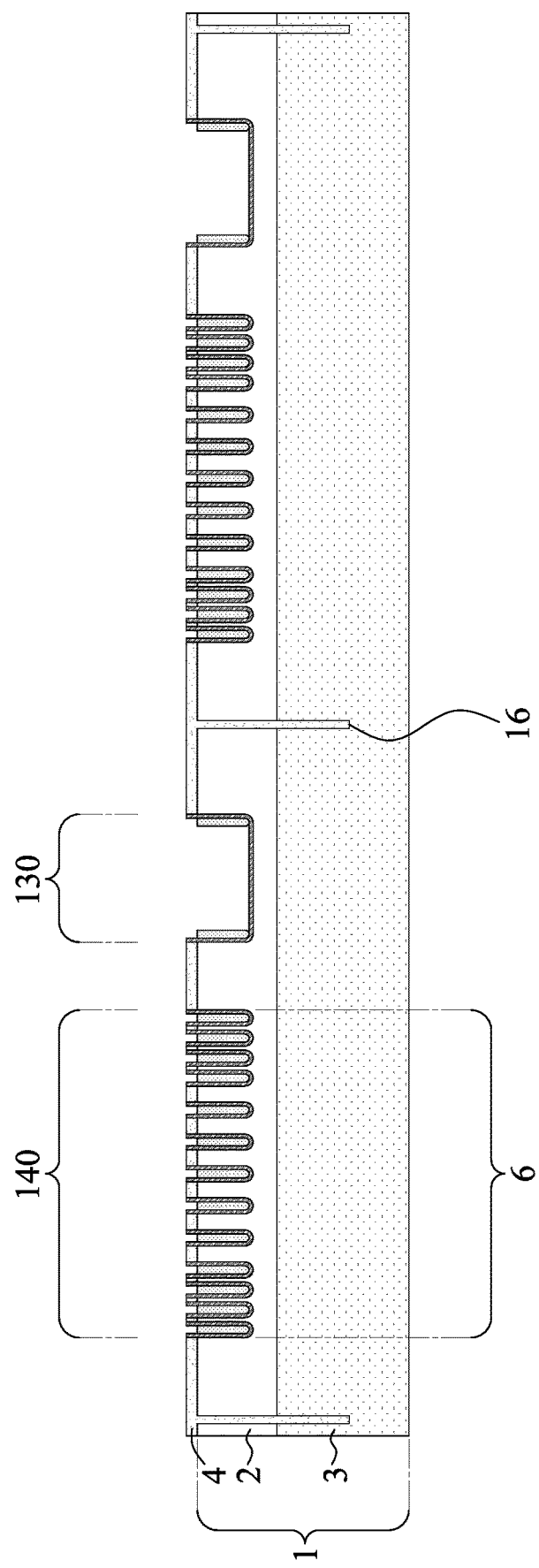
Figure 6C:
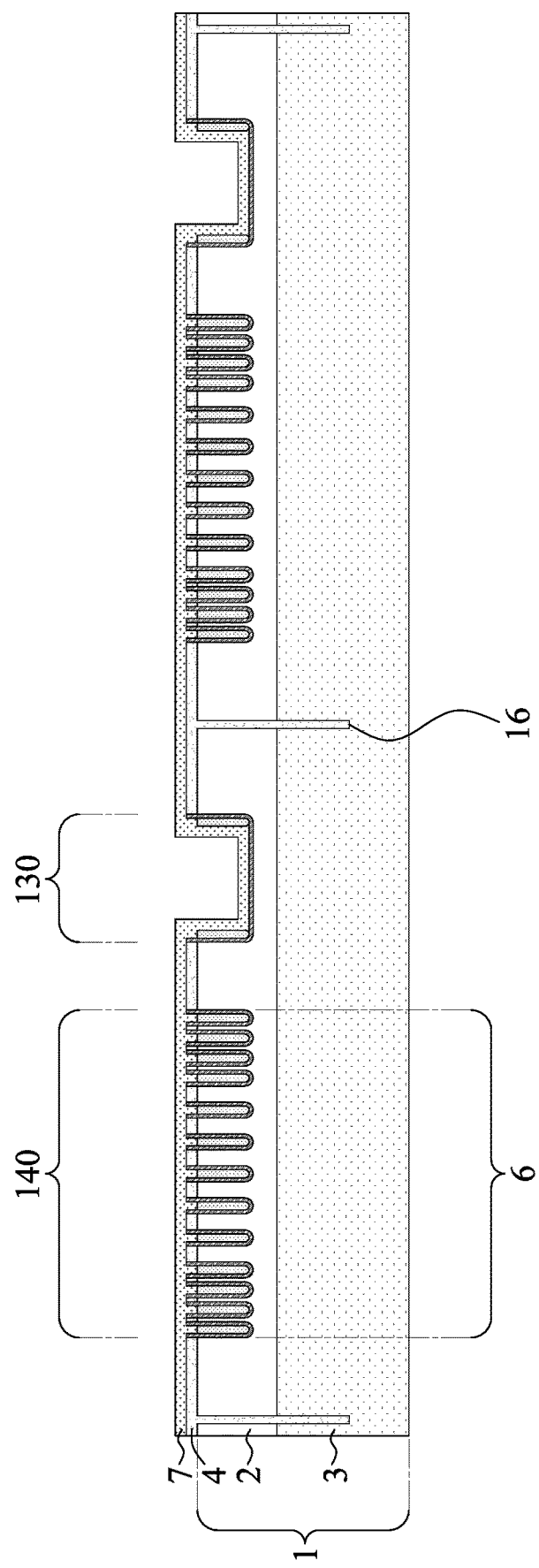

Circuit elements 6 are then fabricated in the way embedded in and on the epitaxial layer 2 of the active region 110. In this embodiment, schottky trenched diodes is fabricated by using photolithography technique where a series of treatment including photoresist application, light exposure, selective etching, photoresist removal and trench etching is performed, resulting in an array of trench in the anode region 140 and cathode region 130. A layer of gate oxide may be formed along the wall of the trenches by thermal oxidation. Then, polysilicon is deposited using CVD so as to fill the trenches as formed in the anode region 140, as illustrated in FIG. 6b. A polysilicon etch-back is performed thereafter to remove the excess portion of the polysilicon, while a layer of polysilicon may be retained around the wall of the trench in the cathode region 130. An interlayer dielectric (ILD) 7 is then deposited on at least a portion of the surface of the semiconductor die 1, as shown in FIG. 6c.

Figure 6D:
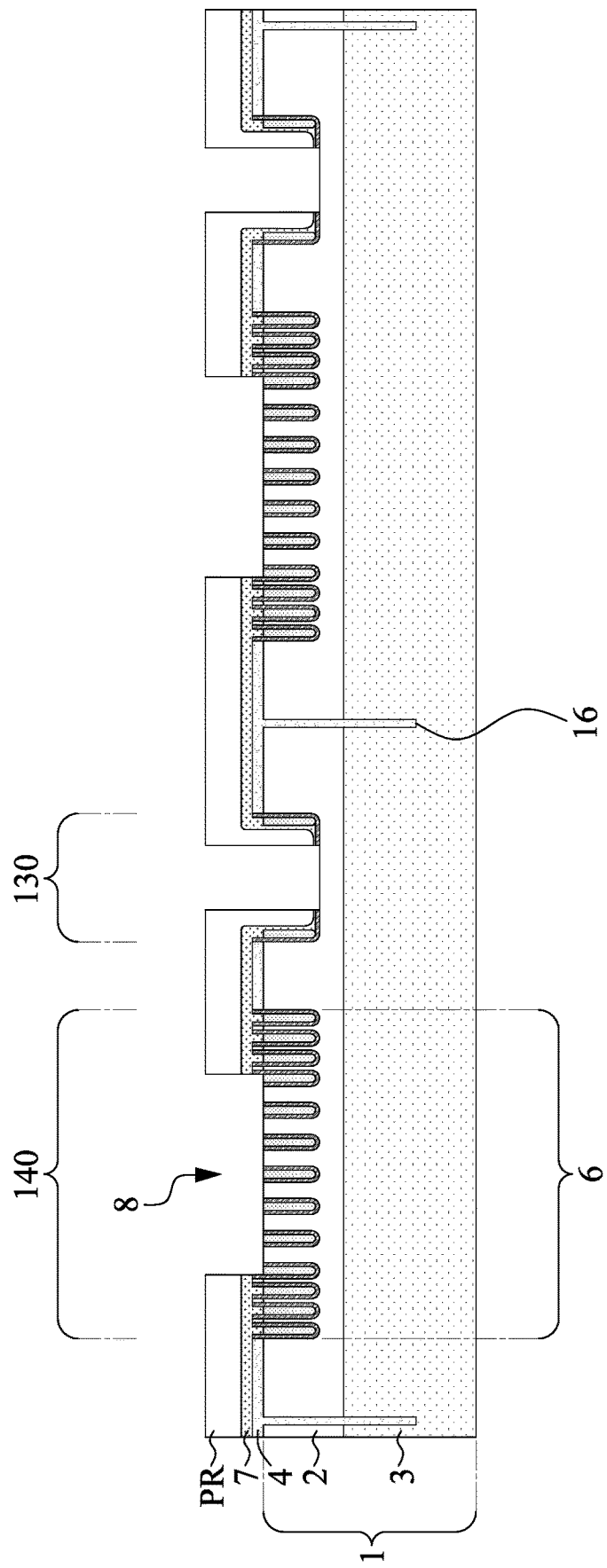

As illustrated in FIG. 6d, a photoresist (PR) is applied on the ILD layer 7. Followed by light exposure and selective etching, a recess of the anode region 8 is formed. The photoresist is removed upon the formation of the anode recess 8.

Figure 6E:
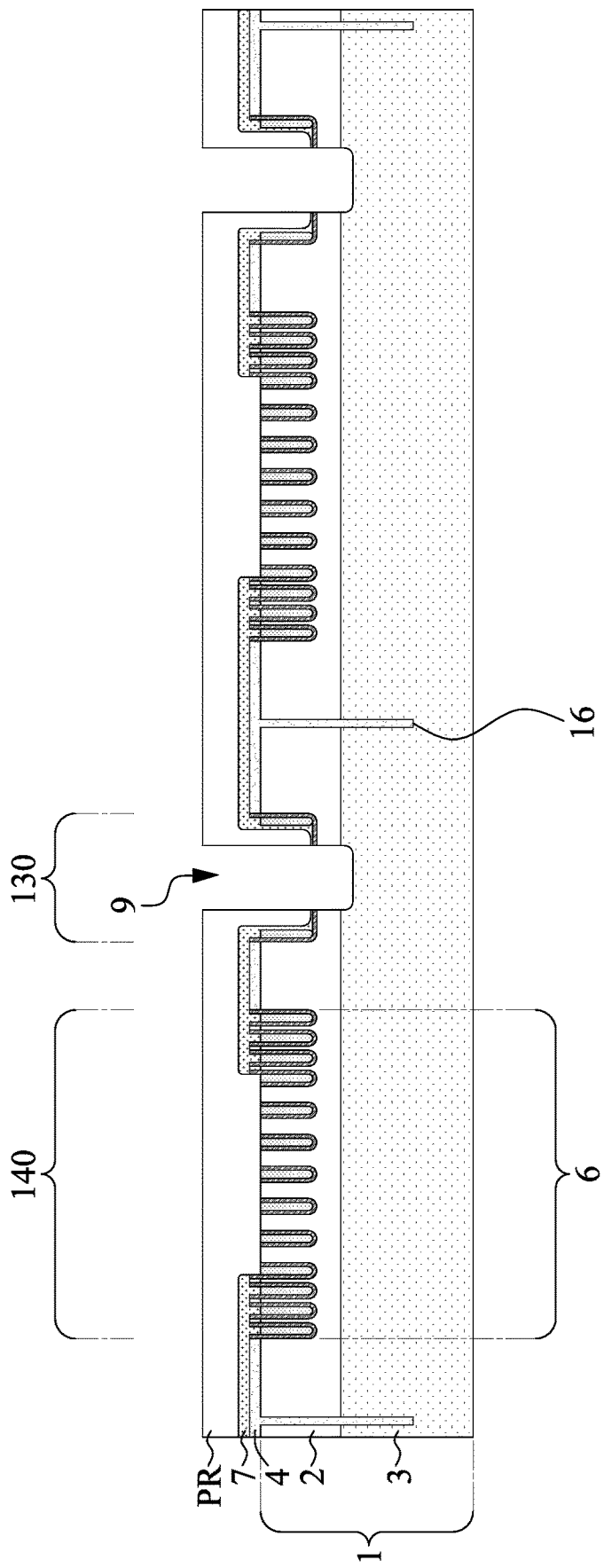

As illustrated in FIG. 6e, another photoresist (PR) is applied on the ILD layer 7. Followed by light exposure and selective etching, a recess of the cathode region 9 is formed. The photoresist is removed upon the formation of the cathode recess 9.

In this embodiment, the bottom of the anode recess 8 reaches the surface of the epitaxial layer 2, while the bottom of the cathode recess 9 reaches the surface of the substrate 3. In some embodiments of the present invention, the bottom of the cathode 9 recess may lie above the substrate 3.

Figure 6F:
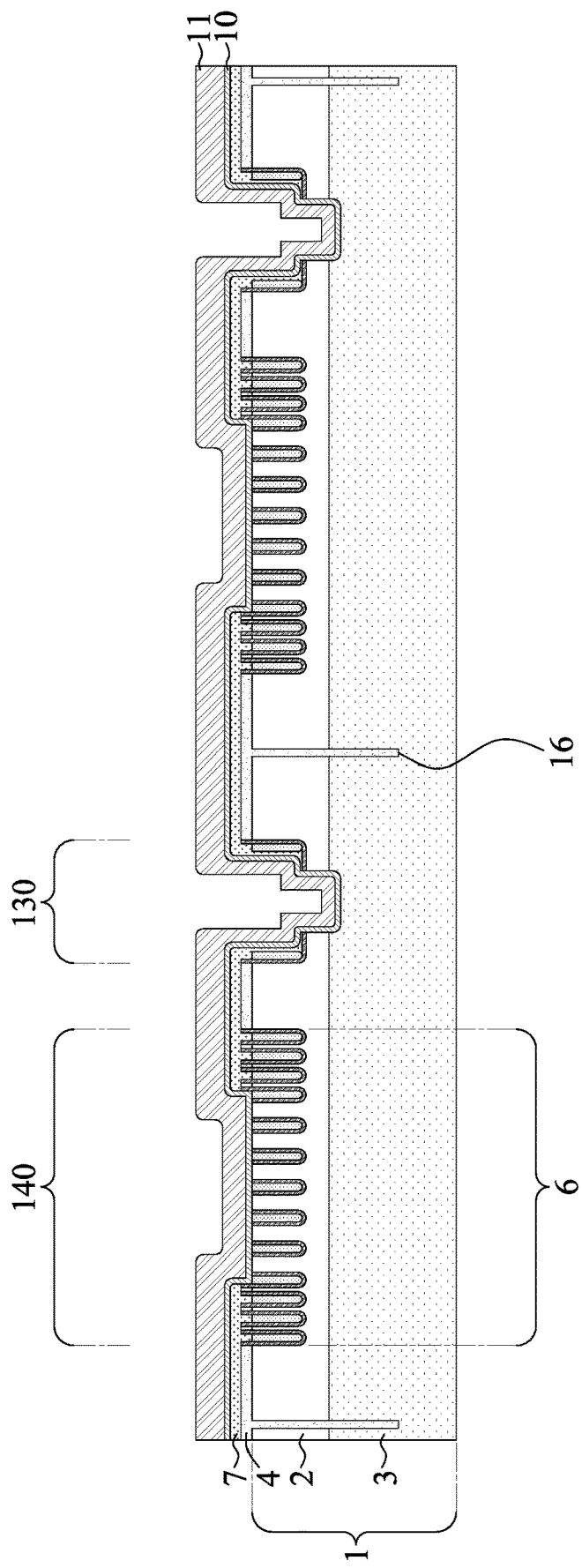

A first metal layer 10 is then formed complying with the topology of the die surface resulted from the previous processes. The first metal layer 10, e.g. using Titanium sputtering, can form schottky junction at the anode recess 8 and form ohmic junction at the cathode recess 9. Further treatment such as a rapid thermal process (RTP) may be further applied to the first metal layer 10. A second metal layer 11, e.g. using AlSiCu sputtering, is then formed on the first metal layer 10 for electrical interconnection amongst different isolated dies (as will be shown in the later stage). A cross-sectional view at this stage is shown in FIG. 6f.

Figure 6G:
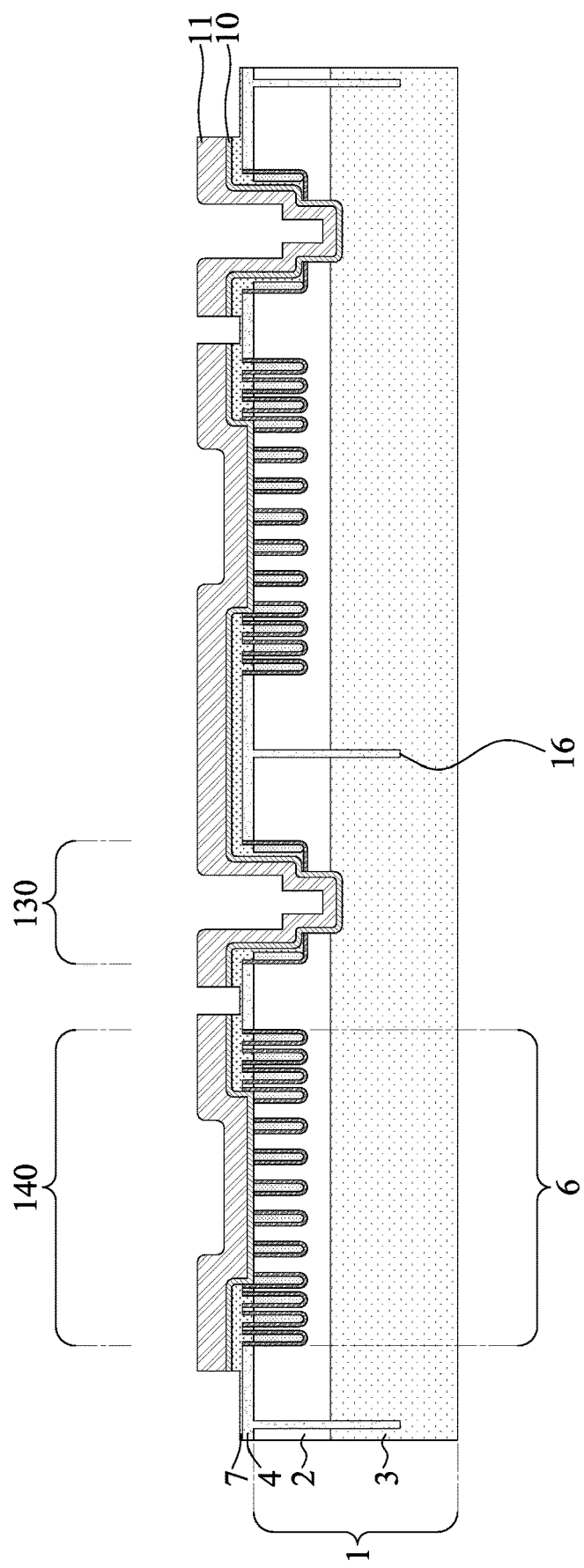

As shown in FIG. 6g. the second metal layer 11 and the first metal layer 10 are then patterned as desired using photolithography technique including photoresist application, selective etching and photoresist removal. A sintering process may be further conducted to adjust the energy barrier height of the schottky junction.

Figure 6H:
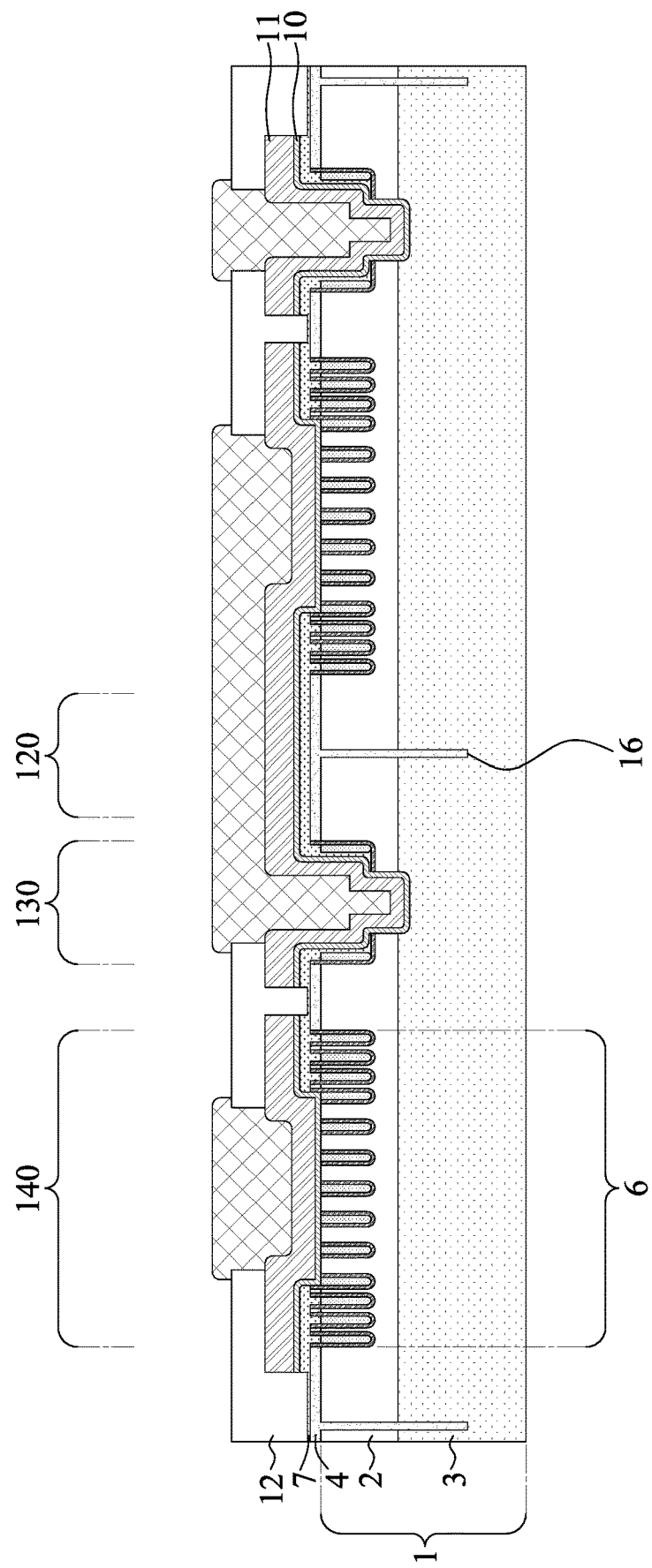

As shown in FIG. 6h, a passivation layer 12, e.g., polyimide, is applied on or around at least a portion of the second metal layer 11 to protect the circuit elements. The pattern of the passivation layer 12 can be achieved by using photolithography technique. A third metal layer 13 is then applied on the portion of the die surface designated for connecting the soldering material (not shown in the figures). The third metal layer 13 can be a chemical plating layer so that the photolithography process is not needed for forming the intended pattern. For example, a composite layer of Ni/Au can be selected as the material of the third metal layer 13.

Figure 6I:
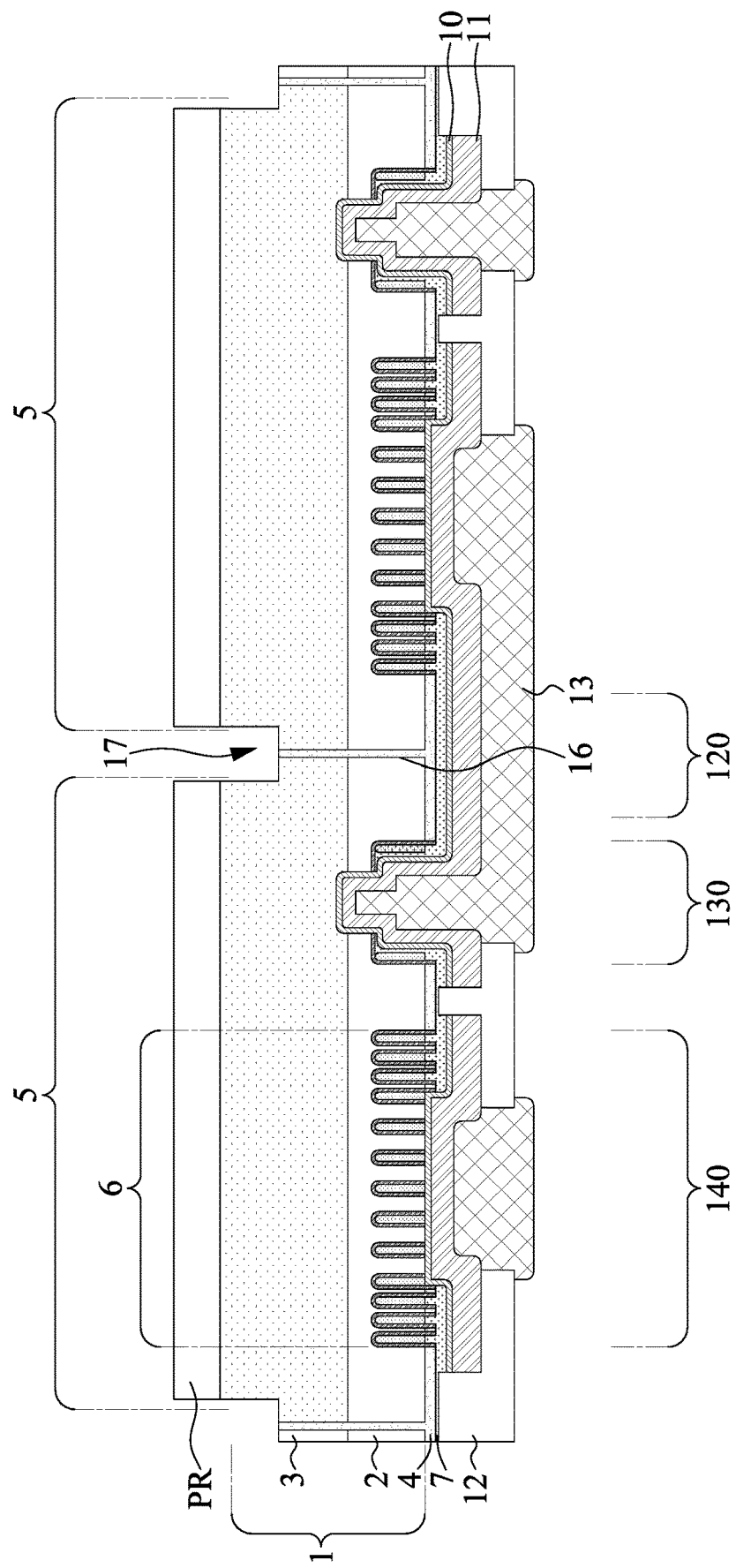
Figure 6J:
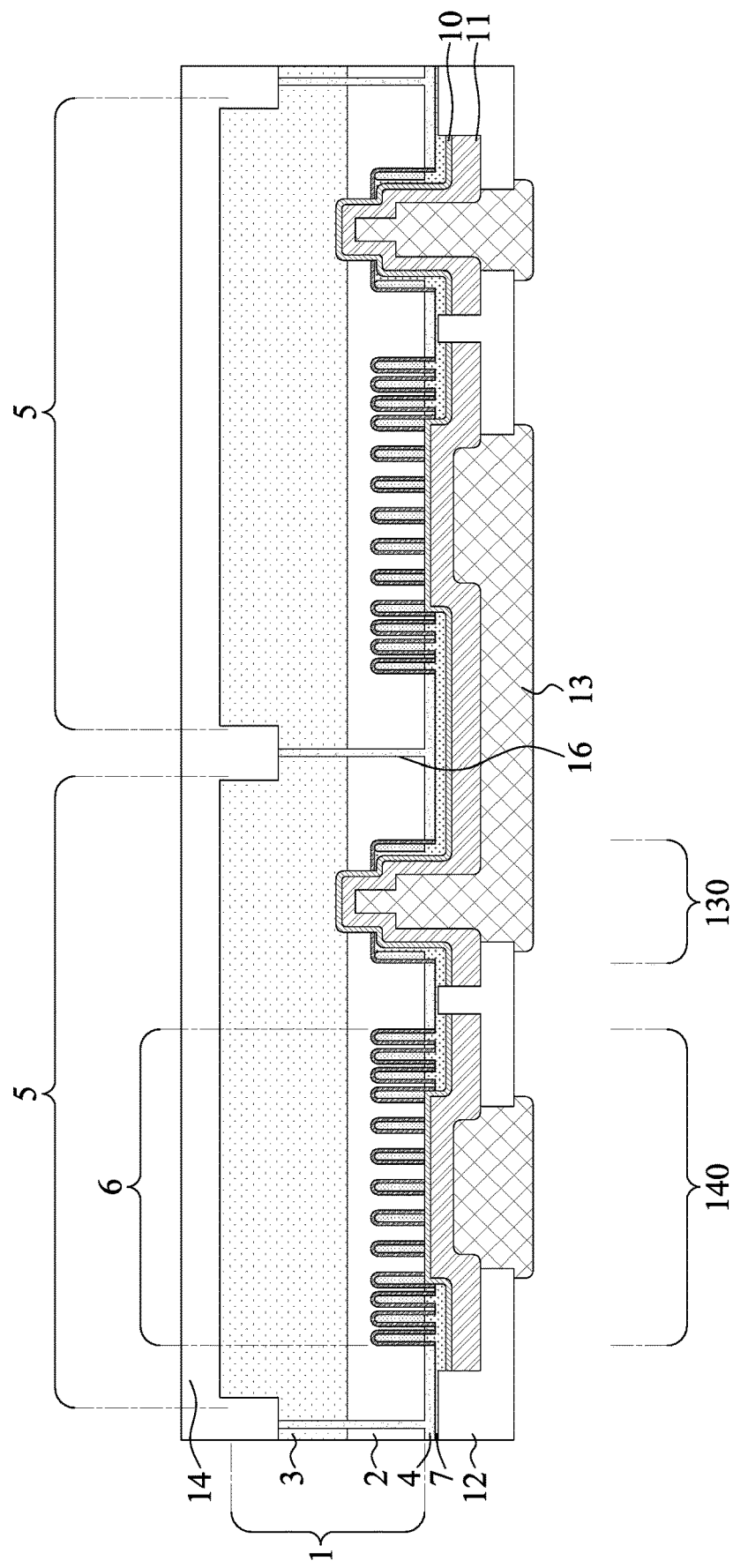
Figure 6K:
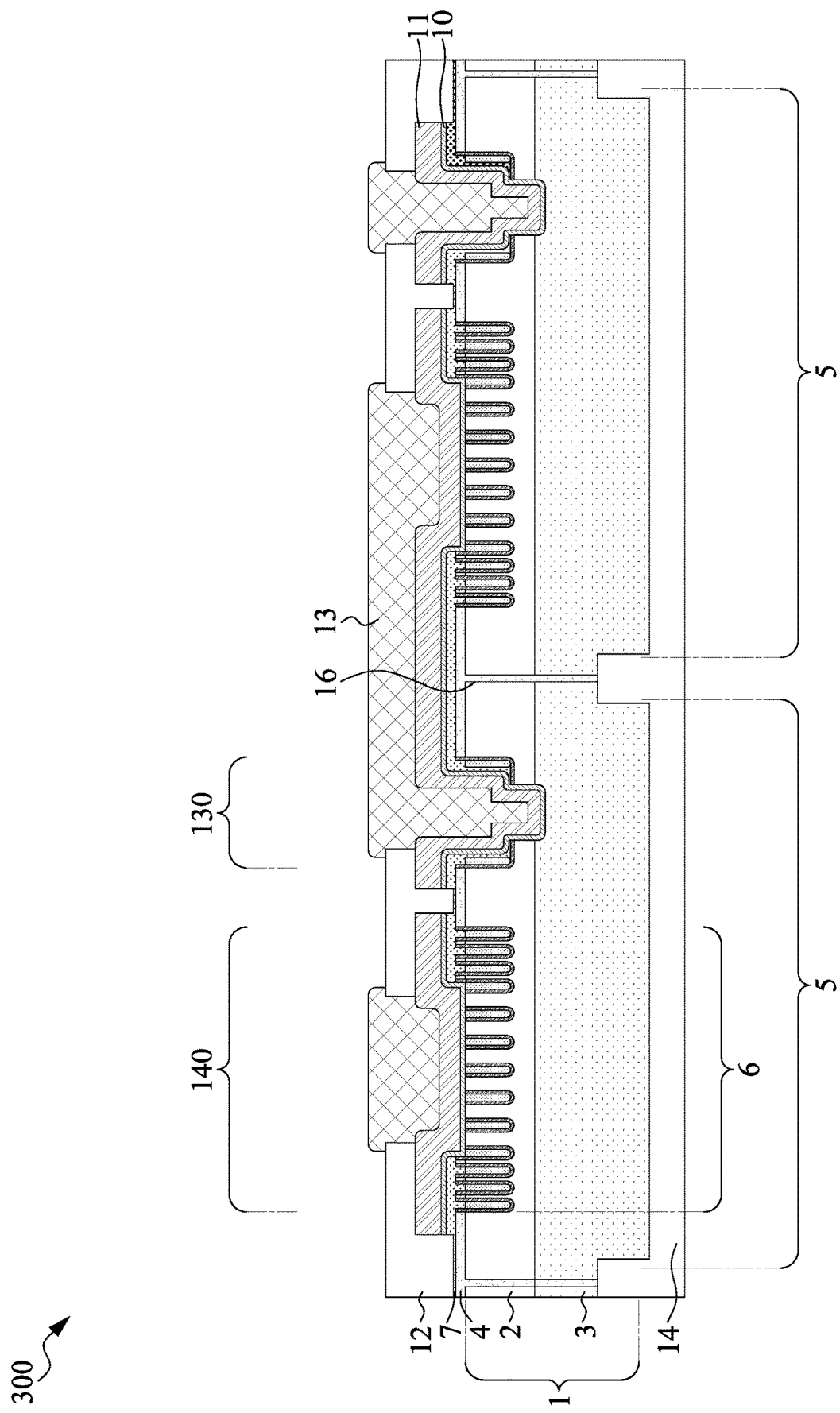

After completing the front-end process, the die is flipped over and back grounded to a thickness of around 70 μm that followed by a back-end etching process which forms a second isolation trench 17 to a height in conjunction with the first isolation trench 16 from the backside of the die. In the situation where the plasma etching process is employed as the back-end etching process, the plasma etching process is carried out along with the photolithography technique to form the second isolation trench 17 at the designated portion of the non-active region 120, as shown in FIG. 6i. The second isolation trench 17 can be formed by plasma etching with a width of around 75 μm. A second dielectric material 14 such as molding compound is then filled into the second isolation trench 17 and encapsulates the isolated semiconductor dies 5 with its sides and bottom, where the portion filled in the second isolation trench 17 of the molding compound forms the second isolation structure, as shown in FIG. 6j. The first isolation structure and the second isolation structure jointly form an isolation structure traversing the thickness of the isolated semiconductor dies 5. The final form of the semiconductor device 300 of this embodiment is illustrated in FIG. 6k.

Figure 7:
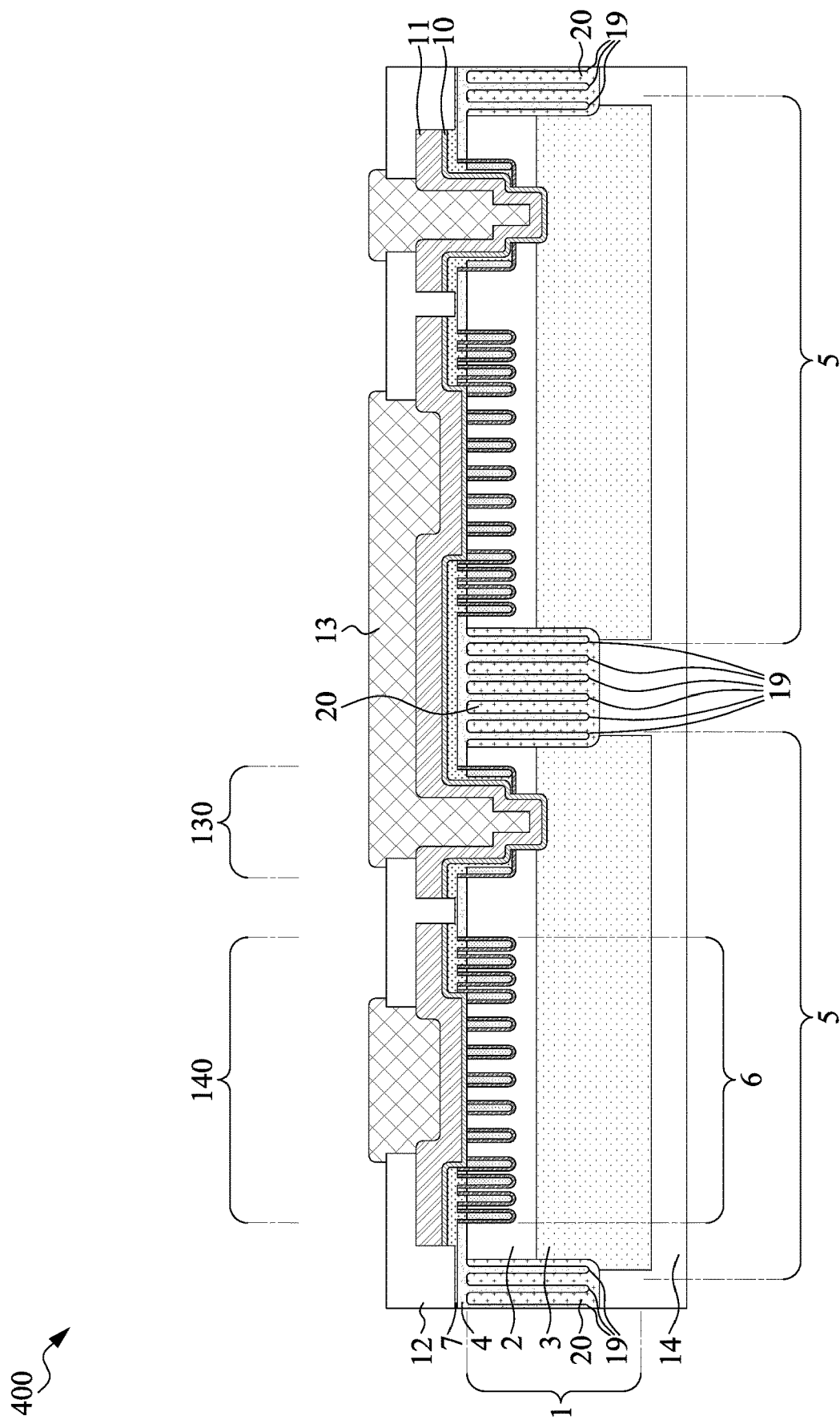
FIG. 7 provides a cross sectional view of the semiconductor device according to the fourth embodiment.

The first isolation trench 16 may include more than one trench structure. In one specific embodiment, the first isolation trench 16 may include a plurality of sub-trench 19 structure, the manufacturing process of forming the plurality of sub-trench 19 can be the same to that of the formation of the single trench structure except that the pattern of the photoresists are different; a thermal oxidation is further carried out to oxidize the remaining mesa portion 20 which set apart each sub-trenches 19 within the non-active region 120. A first dielectric material 4, e.g., silicon dioxides or polysilicon, may be filled into the plurality of sub-trench 19 using CVD, subsequently. In this specific embodiment, the plurality of the sub-trench 19, the oxidized mesa portion 20 and the first dielectric material 4, collaboratively, make up the first isolation trench 16. The final form 400 of this embodiment is shown in FIG. 7.

The reliability in high temperature can be further improved with the third embodiment. Because less amount of the molding compound is filled into the second isolation trench, the thermal stress incurred by the difference of the thermal expansion coefficients between molding compound and silicon dies is mitigated.

Although the present disclosure has been disclosed in the above embodiments, it is not intended to limit the present disclosure, and those skilled in the art can make some modifications and refinements without departing from the spirit and scope of the disclosure. Therefore, the scope of the present disclosure is subject to the definition of the scope of the appended claims.

What is claimed is:

1. A semiconductor device, comprising:
at least two semiconductor dies, each of the at least two semiconductor dies includes a semiconductor substrate and an epitaxial layer formed on the semiconductor substrate;
a layer of a first dielectric material disposed on a top surface of the epitaxial layer; and
an isolation structure electrically isolating two semiconductor dies of the at least two semiconductor dies, the isolation structure comprising an isolation trench extended from the top surface of the epitaxial layer into the semiconductor substrate, and the isolation trench being filled with the first dielectric material and covered by the layer of the first dielectric material;
wherein the semiconductor device further comprises a channel within the at least two semiconductor dies, and a layer of metal is plated in the channel and on a bottom surface of the semiconductor substrate.

2. The semiconductor device of claim 1, wherein the at least two semiconductor dies are fabricated with circuit elements on the epitaxial layer such that terminal nodes of the circuit elements are accessible on a top surface of the at least two semiconductor dies.

3. The semiconductor device of claim 1, further comprising a second dielectric material disposed on a bottom surface of the semiconductor substrate and encapsulating the at least two semiconductor dies.

4. The semiconductor device of claim 3, wherein the first dielectric material is different from the second dielectric material.

5. The semiconductor device of claim 3, wherein the first dielectric material is same as the second dielectric material.

6. The semiconductor device of claim 3, wherein the isolation structure comprises a first isolation structure and a second isolation structure, the first isolation structure is filled with the first dielectric material and the second isolation structure is filled with the second dielectric material, and the first dielectric material is different from the second dielectric material.

7. The semiconductor device of claim 6, wherein the first isolation structure comprises a plurality of sub-trenches.

8. The semiconductor device of claim of claim 1, wherein the isolation trench is between the top surface of the epitaxial layer and a bottom surface of the semiconductor substrate, and the first dielectric material in the isolation trench is connected to the layer of the first dielectric material on the epitaxial layer.

9. The semiconductor device of claim of claim 1, wherein the channel extends from a bottom surface of the semiconductor substrate into the semiconductor substrate.

10. A semiconductor device, comprising:
two semiconductor dies adjacent to each other, each of the two semiconductor dies including a semiconductor substrate and an epitaxial layer formed on the semiconductor substrate;
a layer of a first dielectric material disposed on a bottom surface of the semiconductor substrate; and
an isolation structure between the two semiconductor dies and electrically isolating the two semiconductor dies from each other, the isolation structure comprising a first isolation trench extended from the bottom surface of the semiconductor substrate into the semiconductor substrate, and the first isolation trench being filled with the first dielectric material and covered by the layer of the first dielectric material;
wherein the isolation structure comprises:
a first isolation structure comprising the first isolation trench filled with the first dielectric material; and
a second isolation structure connected to the first isolation structure along a thickness of the two semiconductor dies, the second isolation structure comprising a second isolation trench filled with a second dielectric material, and the second isolation trench extending from a top surface of the epitaxial layer into the semiconductor substrate;
wherein the first isolation trench has a width different from that of the second isolation trench.

11. The semiconductor device of claim 10, wherein the second isolation trench comprises a plurality of separated sub-trenches.

12. The semiconductor device of claim 10, wherein the first dielectric material is different from the second dielectric material.

13. The semiconductor device of claim 10, wherein each of the two semiconductor dies further comprises a channel extending from the bottom surface of the semiconductor substrate into the semiconductor substrate; and a layer of metal is plated in the channel and on the bottom surface of the semiconductor substrate.

14. The semiconductor device of claim 13, wherein the channel comprises a plurality of sub-channels.

15. The semiconductor device of claim 13, wherein the channel is extended through the semiconductor substrate into the epitaxial layer.

16. The semiconductor device of claim of claim 10, wherein the two semiconductor dies are fabricated with circuit elements on the epitaxial layer, with terminal nodes of the circuit elements accessible on a top surface of the two semiconductor dies.

17. A semiconductor device, comprising:
two semiconductor dies adjacent to each other, each of the two semiconductor dies including a semiconductor substrate and an epitaxial layer formed on the semiconductor substrate;
an isolation structure between the two semiconductor dies and electrically isolating the two semiconductor dies from each other, the isolation structure comprising:
a first isolation trench extending from a top surface of the epitaxial layer into the semiconductor substrate; and
a second isolation trench extending from a bottom surface of the semiconductor substrate into the semiconductor substrate and connected to the first isolation trench, wherein the first isolation trench is filled with a first dielectric material and the second isolation trench is filled with a second dielectric material.

18. The semiconductor device of claim 17, wherein the first isolation trench and the second isolation trench have different widths.

19. The semiconductor device of claim 17, wherein the first isolation trench comprises a plurality of separated sub-trenches.

20. The semiconductor device of claim 17, wherein the two semiconductor dies are fabricated with circuit elements on the epitaxial layer, with terminal nodes of the circuit elements accessible on a top surface of the two semiconductor dies.

* * * * *